(12) United States Patent
Vaeth et al.

(10) Patent No.: US 9,728,707 B2
(45) Date of Patent: Aug. 8, 2017

(54) PACKAGED PIEZOELECTRIC ENERGY HARVESTER DEVICE WITH A COMPLIANT STOPPER STRUCTURE, SYSTEM, AND METHODS OF USE AND MAKING

(71) Applicant: MicroGen Systems, Inc., West Henrietta, NY (US)

(72) Inventors: Kathleen M. Vaeth, Penfield, NY (US); David Trauernicht, Rochester, NY (US); Robert G. Andosca, Fairport, NY (US)

(73) Assignee: MicroGen Systems, Inc., West Henrietta, NY (US)

( * ) Notice: Subject to any disclaimer, the term of this patent is extended or adjusted under 35 U.S.C. 154(b) by 430 days.

(21) Appl. No.: 14/173,131

(22) Filed: Feb. 5, 2014

(65) Prior Publication Data

US 2015/0221855 A1 Aug. 6, 2015

(51) Int. Cl.
*H02N 2/18* (2006.01)
*H01L 41/113* (2006.01)
(Continued)

(52) U.S. Cl.
CPC ........ *H01L 41/1136* (2013.01); *H01L 41/053* (2013.01); *H01L 41/1876* (2013.01); *H02N 2/188* (2013.01)

(58) Field of Classification Search
CPC ............. H01L 41/1136; H01L 41/1876; H01L 41/053; H02N 2/188
(Continued)

(56) References Cited

U.S. PATENT DOCUMENTS

| | | |
|---|---|---|
| 3,976,899 A | 8/1976 | Fanshawa |
| 4,445,256 A | 5/1984 | Huguenin et al. |

(Continued)

FOREIGN PATENT DOCUMENTS

| | | |
|---|---|---|
| JP | 54-025192 A | 2/1979 |
| WO | WO 03/096521 | 11/2003 |

OTHER PUBLICATIONS

Singh K. et al "Piezoelectric vibration energy harvesting system with an adaptive frequency tuning mechanism for intelligent tires", Mechatronics 22, Jul. 31, 2012, pp. 970-988, Elsevier, Ltd.*
(Continued)

*Primary Examiner* — Jaydi San Martin
*Assistant Examiner* — Karen B Addison
(74) *Attorney, Agent, or Firm* — LeClairRyan, a Professional Corporation

(57) ABSTRACT

The present invention relates to an energy harvester device comprising an elongate resonator beam comprising a piezoelectric material, the resonator beam extending between first and second ends; a base connected to the resonator beam at the first end with the second end being freely extending from the base as a cantilever; a mass attached to the second end of the resonator beam; a package surrounding at least a portion of the second end of the resonator beam; and a compliant stopper connected to the package, where the stopper is configured to stabilize motion of the cantilever to prevent breakage. Also disclosed is a system, a method of powering an electrically powered apparatus, and methods of producing an energy harvester device.

12 Claims, 19 Drawing Sheets

(51) Int. Cl.
*H01L 41/187* (2006.01)
*H01L 41/053* (2006.01)
(58) Field of Classification Search
USPC ....... 310/339, 311, 328, 329, 330, 314, 321, 310/370, 319; 73/753
See application file for complete search history.

(56) References Cited

U.S. PATENT DOCUMENTS

| | | | |
|---|---|---|---|
| 5,248,912 A | 9/1993 | Zdeblick et al. | |
| 5,646,583 A | 7/1997 | Seabury et al. | |
| 5,708,320 A | 1/1998 | Ohnishi et al. | |
| 6,078,126 A | 6/2000 | Rollins et al. | |
| 6,396,201 B1 | 5/2002 | Ide et al. | |
| 6,796,011 B2 | 9/2004 | Takeuchi et al. | |
| 6,858,970 B2 | 2/2005 | Malkin et al. | |
| 7,839,058 B1 | 11/2010 | Churchill et al. | |
| 7,919,345 B1 | 4/2011 | Kirsten et al. | |
| 7,936,109 B1 | 5/2011 | Gao | |
| 8,080,920 B2 | 12/2011 | Andosca et al. | |
| 8,134,282 B1 * | 3/2012 | Churchill | H01L 41/1136 310/329 |
| 8,222,754 B1 | 7/2012 | Soliman | |
| 8,319,402 B1 | 11/2012 | Churchill et al. | |
| 8,680,752 B2 | 3/2014 | Ayazi | |
| 9,054,294 B2 * | 6/2015 | Haskett | H01L 41/053 |
| 2003/0214200 A1 | 11/2003 | Thompson et al. | |
| 2004/0115711 A1 | 6/2004 | Su et al. | |
| 2005/0028336 A1 | 2/2005 | Robert | |
| 2005/0134149 A1 | 6/2005 | Deng et al. | |
| 2005/0205125 A1 | 9/2005 | Nersessian et al. | |
| 2005/0253486 A1 | 11/2005 | Schmidt | |
| 2007/0125176 A1 | 6/2007 | Liu | |
| 2007/0284969 A1 | 12/2007 | Xu | |
| 2009/0200896 A1 | 8/2009 | Morris et al. | |
| 2009/0205435 A1 | 8/2009 | Buck | |
| 2009/0212665 A1 | 8/2009 | Koser | |
| 2009/0284102 A1 | 11/2009 | Karakaya et al. | |
| 2010/0019623 A1 | 1/2010 | Yao et al. | |
| 2010/0072759 A1 | 3/2010 | Andosca et al. | |
| 2010/0194240 A1 | 8/2010 | Churchill et al. | |
| 2011/0264293 A1 | 10/2011 | Arms et al. | |
| 2011/0277286 A1 | 11/2011 | Zhang | |
| 2011/0309618 A1 | 12/2011 | Gieras et al. | |
| 2012/0049694 A1 | 3/2012 | Van Schaijk et al. | |
| 2013/0088123 A1 | 4/2013 | Haskett | |
| 2013/0221802 A1 | 8/2013 | Oh | |
| 2013/0341936 A1 | 12/2013 | Wood et al. | |
| 2014/0265726 A1 | 9/2014 | Andosca | |
| 2015/0295520 A1 | 10/2015 | Hasegawa | |

OTHER PUBLICATIONS

International Search Report for International Patent Application No. PCT/US2014/021905 (Aug. 15, 2014).
International Search Report for International Patent Application No. PCT/US2014/035296 (Aug. 22, 2014).
International Search Report for International Patent Application No. PCT/US2014/035318 (Dec. 31, 2014).
Altena G., et al., "Design improvements for an electret-based MEMS vibrational electrostatic energy harvester", Journal of Physics: Conference Series 476 (2013) 012078, PowerMEMS2013, pp. 371-374, IOP Publishing.
Andosca R., et al., "Experimental and theoretical studies on MEMS piezoelectric vibrational energy harvesters with mass loading", Sensors and Actuators A: Physical, 2012, pp. 1-12, Elsevier B.V.
Beeby et al., "Energy harvesting vibration sources for microsystems applications," Meas. Sci. Technol., Measurement Science and Technology, 2006, pp. R175-R195, IOP Publishing Ltd.
International Search Report, corresponding to PCT/US14/65628, mailed Jul. 24, 2015.
Office Action for U.S. Appl. No. 14/145,560 dated Jan. 21, 2016, pp. 1-11.
Office Action for U.S. Appl. No. 14/145,534 dated Feb. 4, 2016, pp. 1-13.
Office Action for U.S. Appl. No. 14/260,930 dated Oct. 20, 2015, pp. 1-17.
Office Action for U.S. Appl. No. 14/290,425 dated Oct. 3, 2016, pp. 1-12.
International Preliminary Report on Patentability for International Patent Application No. PCT/US2014/035318 (Sep. 13, 2016), pp. 1-6.
Supplementary European Search Report for EP Application No. 14779322.8 dated Oct. 19, 2016, pp. 1-7.
International Preliminary Report on Patentability for International Patent Application No. PCT/US2014/035296 (Nov. 3, 2016), pp. 1-7.
European Search Report for European Application No. 13877574.7 (Aug. 1, 2016), pp. 1-6.
International Search Report for International Patent Application No. PCT/US2014/014797 (Aug. 18, 2016), pp. 1-6.
Elfrink R., et al., "Vaccum Packaged MEMS Piezoelectric Vibration Energy Harvester", PowerMEMS, 2009, pp. 67-70.
Gu L., et al., "Impact-driven, frequency up-converting coupled vibration energy harvesting device for low frequency operation", Smart Mater, Struct., 20, Mar. 8, 2011, pp. 1-10, IOP Publishing.
Marzencki, M., et al., "A MEMS Piezoelectric Vibration Energy Harvesting Device", PowerMEMS, Nov. 28-30, 2005, pp. 45-48.
Renaud M., et al., "Optimum power and efficiency of piezoelectric vibration energy harvesters with sinusoidal and random vibrations", J. Micromech, Microeng. 22, Sep. 10, 2012, pp. 1-13, IOP Publishing.
Schroder C., et al., "Wafer-Level Packaging of ALN-Based Piezoelectric Micropower Generators", PowerMEMS, Dec. 2-5, 2012, pp. 343-346.
Schroder C., et al., "ALN-Based Piezoelectric Micropower Generator for Low Ambient Vibration Energy Harvesting", 2011, pp. 1-4.
Singh K., et al., "Piezoelectric vibration energy harvesting system with an adaptive frequency tuning mechanism for intelligent tires", Mechatronics 22, Jul. 31, 2012, pp. 970-988, Elsevier, Ltd.
Stoppel et al., "AlN-Based piezoelectric micropower generator for low ambient vibration energy harvesting," Porcedia Engineer. 25, Sep. 4-7, 2011, pp. 721-724, Elsevier, Ltd.
Tang L., et al., "Toward Broadband Vibration-based Energy Harvesting", Journal of Intelligent Material Systems and Structures, vol. 21, Dec. 2010, pp. 1867-1897, Sage Publications.
Schaijk, R., et al., "A MEMS vibration energy harvester for automotive applications", Proc. of SPIE vol. 8763, 2013, pp. 1-10.
Wang Z., et al., "Shock Reliability of Vacuum-Packaged Piezoelectric Vibration Harvester for Automotive Application", Journal of Microelectromechanical Systems, vol. 23, No. 3, Jun. 2014, pp. 539-548, IEEE.
Zhu D., et al., "Strategies for increasing the operating frequency range of vibration energy harvesters: a review", Meas. Sci. Technol. 21, Dec. 15, 2010, pp. 1-29, IOP Publishing.
International Search Report for International Patent Application No. PCT/US2014/014797 (May 23, 2014).
International Search Report for International Patent Application No. PCT/US2013/78520 (May 4, 2014).

* cited by examiner

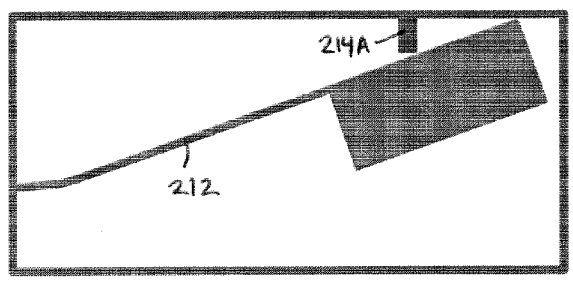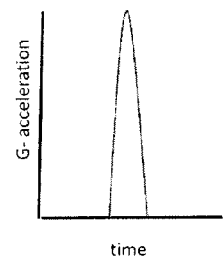
FIG. 3A
PRIOR ART
FIG. 3B
PRIOR ART
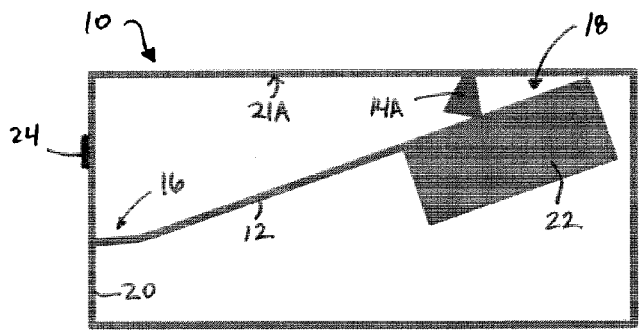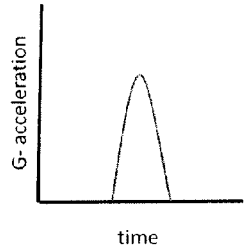
FIG. 4A
FIG. 4B

PACKAGED PIEZOELECTRIC ENERGY HARVESTER DEVICE WITH A COMPLIANT STOPPER STRUCTURE, SYSTEM, AND METHODS OF USE AND MAKING

FIELD OF THE INVENTION

The present invention relates to a packaged piezoelectric energy harvester device with a compliant cantilever stopper structure, a system containing the device, and methods of using and making the device.

BACKGROUND OF THE INVENTION

Reduction in both size and power consumption of integrated circuits has led to the proliferation of wireless technology. For example, there is a wide variety of devices using low-power wireless circuits, including tablets; smartphones; cell phones; laptop computers; MP3 players; telephony headsets; headphones; routers; gaming controllers; mobile internet adaptors; wireless sensors; tire pressure sensor monitors; wearable sensors that communicate with tablets, PCs, and/or smartphones; devices for monitoring livestock; medical devices; human body monitoring devices; toys; etc. Each of these devices requires a standalone power supply to operate. Typically, power supplies for these devices are electrical batteries, often replaceable batteries.

Other wireless technologies of significant interest are wireless sensors and wireless sensor networks. In such networks, wireless sensors are distributed throughout a particular environment to form an ad hoc network that relays measurement data to a central hub. Particular environments include, for example, an automobile, an aircraft, a factory, or a building. A wireless sensor network may include several to tens of thousands of wireless sensor "nodes" that operate using multi-hop transmissions over distances. Each wireless node will generally include a sensor, wireless electronics, and a power source. These wireless sensor networks can be used to create an intelligent environment responding to environmental conditions.

A wireless sensor node, like the other wireless devices mentioned above, requires standalone electrical power to operate the electronics of that node. Conventional batteries, such as lithium-ion batteries, zinc-air batteries, lithium batteries, alkaline batteries, nickel-metal-hydride batteries, and nickel-cadmium batteries, could be used. However, it may be advantageous for wireless sensor nodes to function beyond the typical lifetime of such batteries. In addition, battery replacement can be burdensome, particularly in larger networks with many nodes.

Alternative standalone power supplies rely on scavenging (or "harvesting") energy from the ambient environment. For example, if a power-driven device is exposed to sufficient light, a suitable alternative standalone power supply may include photoelectric or solar cells. Alternatively, if the power-driven device is exposed to sufficient air movement, a suitable alternative standalone power supply may include a turbine or micro-turbine for harvesting power from the moving air. Other alternative standalone power supplies could also be based on temperature fluctuations, pressure fluctuations, or other environmental influences.

Some environments do not include sufficient amounts of light, air movement, temperature fluctuation, and/or pressure variation to power particular devices. Under such environments, the device may nevertheless be subjected to fairly predictable and/or constant vibrations, e.g., emanating from a structural support, which can be in the form of either a vibration at a constant frequency, or an impulse vibration containing a multitude of frequencies. In such cases, a scavenger (or harvester) that essentially converts movement (e.g., vibrational energy) into electrical energy can be used.

One particular type of vibrational energy harvester utilizes resonant beams that incorporate a piezoelectric material that generates electrical charge when strained during resonance of the beams caused by ambient vibrations (driving forces).

When a microelectromechanical ("MEMS") cantilever piezoelectric energy harvester is placed in an enclosed package (including packages that are under vacuum, packages that are overpressured, or packages that are at atmospheric pressure and may additionally be vented), there is potential for the piezoelectric cantilever, during deflection (particularly at higher G levels), to interact with the top or bottom of the package once the deflection of the package equals the package height. This can ultimately lead to the deformation of the cantilever and breakage. It has been reported in the literature that this deformation can be alleviated by incorporating a feature (e.g., a stopper) in the top and bottom cap of the packaging to stabilize the cantilever during impact. This feature is implemented in the form of a rigid shelf or pillar made out of glass or silicon. New features are needed that impart greater robustness of the packaged energy harvester, particularly when packaged in a low pressure environment.

The present invention is directed to overcoming these and other deficiencies in the art.

SUMMARY OF THE INVENTION

One aspect of the present invention relates to an energy harvester device comprising an elongate resonator beam comprising a piezoelectric material, the resonator beam extending between first and second ends; a base connected to the resonator beam at the first end with the second end being freely extending from the base as a cantilever; a mass attached to the second end of the resonator beam; a package surrounding at least a portion of the second end of the resonator beam; and a compliant stopper connected to the package, where the stopper is configured to stabilize motion of the cantilever to prevent breakage.

Another aspect of the present invention relates to a system comprising an electrically powered apparatus and the energy harvester device of the present invention electrically coupled to the apparatus.

A further aspect of the present invention relates to a method of powering an electrically powered apparatus. This method involves providing the system according to the present invention; subjecting the system to movement or vibrations to generate electrical energy from the piezoelectric material; and transferring the electrical energy from the piezoelectric material to the apparatus to provide power to the apparatus.

The packaged energy harvester device of the present invention incorporates a compliant stopper feature to provide the function of stabilizing the cantilever/package interaction. The stopper is made to have some compliance, either through material choice or design, or both, so as to modify the pulse width of the impact, and subsequently, the acceleration level experienced by the cantilever on impact with the package. This lowering of the experienced acceleration will lead to even greater robustness of the packaged energy harvester, particularly when packaged in a low pressure environment.

BRIEF DESCRIPTION OF THE DRAWINGS

In FIG. 2A, the energy harvester device has no stopper structure on interior walls of the package. Consequently, the cantilever structure contacts the interior walls of the package during deflection, which results in deformation of the cantilever and possible breakage. In FIG. 2B, the energy harvester device includes a stopper structure on two opposing interior walls of the package. However, the stopper structures are formed of a rigid, non-compliant material which experience no deformation in shape (compliance) upon contact with the piezoelectric cantilever structure contained within the package. This too may cause deformation of the cantilever and possible breakage.

FIGS. 3A-B illustrate the G-acceleration profile (FIG. 3B) of the cantilever structure of the energy harvester device of the prior art shown in FIG. 2 in which the cantilever contacts a stopper positioned on an interior wall of the package which has minimal or no compliance (i.e., is rigid) (FIG. 3A).

FIG. 4A-B illustrate the G-acceleration profile (FIG. 4B) of the cantilever structure of one embodiment of an energy harvester device of the present invention, in which the cantilever contacts a compliant stopper structure on the interior wall of the package (FIG. 4A). In FIG. 4A, the particular embodiment of the energy harvester device of the present invention which is illustrated includes a resonator beam having a first and second end, the resonator beam comprising a piezoelectric material; a base connected to the resonator beam at the first end with the second end being freely extending from the base as a cantilever; a mass attached to the second end of the resonator beam; and a package surrounding the resonator beam. A compliant stopper is connected to the package, and the stopper is configured to stabilize motion of the cantilever to prevent breakage and/or deformation of the cantilever.

FIGS. 6A-B are front views of compliant stoppers in the form of a rod or cylinder (FIG. 6A) or a partial cylinder (FIG. 6B) formed length-wise parallel to the resonator beam along an interior (upper) wall.

FIG. 9A shows the energy harvester device before the cantilever contacts a compliant stopper structure and FIG. 9B shows the energy harvester device after the cantilever contacts a compliant stopper structure.

FIG. 10A shows the energy harvester device before the cantilever contacts the dual compliant stoppers on one of the interior walls of the package and FIG. 10B shows the energy harvester device after the cantilever contacts the dual compliant stoppers.

FIG. 11A shows the energy harvester device before the cantilever contacts a compliant stopper and FIG. 11B shows the energy harvester device after the cantilever contacts a compliant stopper.

FIG. 12A shows the energy harvester device before the cantilever contacts a compliant stopper and FIG. 12B shows the energy harvester device after the cantilever contacts a compliant stopper.

FIGS. 13A-B are side views of compliant stoppers. FIG. 13C is a front view of the compliant stopper shown in FIG. 13B. These structures are particularly useful, e.g., when the compliant stoppers are formed on one of the interior walls of the package and one of the compliant stoppers is connected to the package above the resonator beam and the other compliant stopper is connected to the package below the resonator beam.

In FIGS. 14A-B, the compliant stopper is constructed of a compliant material that deforms upon contact with the resonator beam to stabilize motion of the cantilever to prevent breakage and/or deformation of the cantilever. FIG. 14A shows the energy harvester device before the cantilever contacts the compliant stopper and FIG. 14B shows the energy harvester device after the cantilever contacts the compliant stopper. In FIG. 14C, the compliant stopper is constructed in a way that it moves its position to create a compliant effect. Also, the energy harvester device shown in FIG. 14C has a base to which the cantilever is connected, where the base is a separate structure from the package, as opposed to the cantilever being connected to or integral with the package, as illustrated in FIGS. 14A-B.

FIG. 26 shows the upper portion of energy harvester device 10 of FIG. 11A, with compliant stopper 14A in place.

FIG. 28 shows the upper portion of energy harvester device 10 of FIG. 15, with compliant stopper 14A in place.

DETAILED DESCRIPTION OF THE INVENTION

The present invention relates to a packaged piezoelectric energy harvester device, a system comprising the piezoelectric energy harvester device, and methods of using and making the piezoelectric energy harvester device. The piezoelectric energy harvester device of the present invention incorporates a compliant stopper formed on a package to provide the function of stabilizing the cantilever/package interaction.

One aspect of the present invention relates to an energy harvester device comprising an elongate resonator beam comprising a piezoelectric material, the resonator beam extending between first and second ends; a base connected to the resonator beam at the first end with the second end being freely extending from the base as a cantilever; a mass attached to the second end of the resonator beam; a package surrounding at least a portion of the second end of the resonator beam; and a compliant stopper connected to the package, where the stopper is configured to stabilize motion of the cantilever to prevent breakage.

Figure 1:
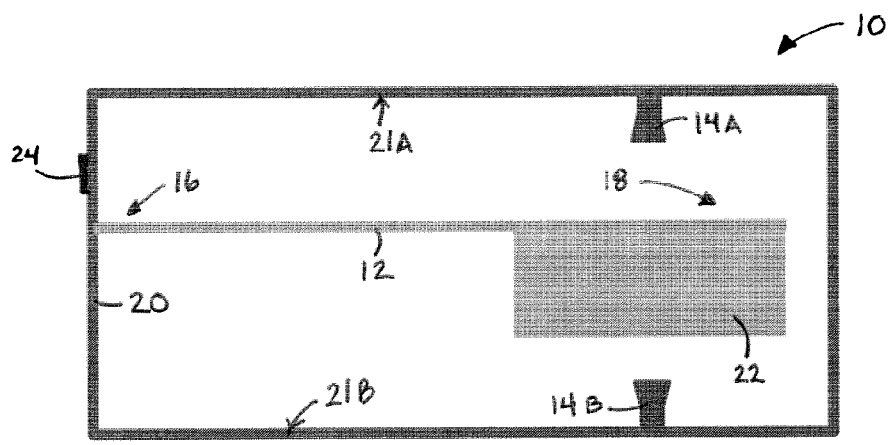
FIG. 1 is a side view (or side, cross-section view) of one embodiment of an energy harvester device of the present invention which includes a resonator beam having a first and second end, the resonator beam comprising a piezoelectric material; a base connected to the resonator beam at the first end with the second end being freely extending from the base as a cantilever; a mass attached to the second end of the resonator beam; and a package surrounding the resonator beam. The base is formed integral with the package. Two compliant stoppers are connected to the package on opposing interior walls near the second end of the resonator beam. The stoppers are configured to stabilize motion of the cantilever to prevent breakage and/or deformation of the cantilever.

With reference to FIG. 1, a side (or cross-sectional) view of one embodiment of an energy harvester device of the present invention is illustrated. Specifically, energy harvester device 10 includes resonator beam 12 comprising a piezoelectric material. Resonator beam 12 extends between first end 16 of resonator beam 12 and second end 18 of resonator beam 12. Base 20, which also forms a package surrounding at least a portion of second 18 of resonator beam 12, is connected to resonator beam 12 at first end 16 with second end 18 being freely extending from base 20 as a cantilever. Energy harvester device 10 also includes mass 22 attached to second end 18 of resonator beam 12. Compliant stoppers 14A and 14B are formed on interior walls 21A and 21B of package 20 and are configured to stabilize motion of the cantilever to prevent deformation and/or breakage of the cantilever.

Energy harvester device 10 also includes one or more electrodes 24 in electrical contact with the piezoelectric material of resonator beam 12. According to one embodiment, electrodes 24 comprise a material selected from the group consisting of molybdenum and platinum, although other materials suitable for forming electrode structures may also be used. In addition, energy harvester device 10 may further include electrical harvesting circuitry in electrical connection with one or more electrodes 24 to harvest electrical energy from the piezoelectric material of resonator beam 12. As described in further detail below, the electrical harvesting circuitry can be electrically coupled to an electrically powered apparatus to provide power generated from the piezoelectric material and supplied to the apparatus.

Resonator beam 12 of energy harvester device 10 comprises a piezoelectric material. Piezoelectric materials are materials that when subjected to mechanical strain become electrically polarized. The degree of polarization is proportional to the applied strain. Piezoelectric materials are widely known and available in many forms including single crystal (e.g., quartz), piezoceramic (e.g., lead zirconate titanate or PZT), thin film (e.g., sputtered zinc oxide), screen printable thick-films based upon piezoceramic powders (see, e.g., Baudry, "Screen-printing Piezoelectric Devices," *Proc. 6th European Microelectronics Conference* (*London, UK*) pp. 456-63 (1987) and White & Turner, "Thick-film Sensors: Past, Present and Future," *Meas. Sci. Technol.* 8:1-20 (1997), which are hereby incorporated by reference in their entirety), and polymeric materials such as polyvinylidenefluoride ("PVDF") (see, e.g., Lovinger, "Ferroelectric Polymers," *Science* 220:1115-21 (1983), which is hereby incorporated by reference in its entirety).

Piezoelectric materials typically exhibit anisotropic characteristics. Thus, the properties of the material differ depending upon the direction of forces and orientation of the polarization and electrodes. The level of piezoelectric activity of a material is defined by a series of constants used in conjunction with the axes of notation. The piezoelectric strain constant, d, can be defined as $$d = \frac{\text{strain developed}}{\text{applied field}} \text{m/V}$$

(Beeby et al., "Energy Harvesting Vibration Sources for Microsystems Applications," *Meas. Sci. Technol.* 17:R175-R195 (2006), which is hereby incorporated by reference in its entirety).

In the energy harvester device of the present invention, resonator beam 12 has second end 18, which is freely extending from base 20 as a cantilever. A cantilever structure comprising piezoelectric material is designed to operate in a bending mode thereby straining the piezoelectric material and generating a charge from the d effect (Beeby et al., "Energy Harvesting Vibration Sources for Microsystems Applications," *Meas. Sci. Technol.* 17:R175-R195 (2006), which is hereby incorporated by reference in its entirety). A cantilever provides low resonant frequencies, reduced further by the presence of mass 22 attached at second end 18 of resonator beam 12.

Resonant frequencies of resonator beam 12 of energy harvester device 10 of the present invention in operation may include frequencies of about 50 Hz to about 4,000 Hz, about 100 Hz to about 3,000 Hz, about 100 Hz to about 2,000 Hz, or about 100 Hz to about 1,000 Hz.

According to one embodiment, resonator beam 12 comprises a laminate formed of a plurality of layers, at least one of which comprises a piezoelectric material. Suitable piezoelectric materials include, without limitation, aluminum nitride, zinc oxide, polyvinylidene fluoride (PVDF), and lead zirconate titinate based compounds. Other non-piezoelectric materials may also be used as layers along with a layer of piezoelectric material. Non-limiting examples of other layers include those described below with respect to the layered material stack (50) of FIG. 17.

Resonator beam 12 may have sidewalls that take on a variety of shapes and configurations to help tuning of resonator beam 12 and to provide structural support. According to one embodiment, resonator beam 12 has sidewalls which are continuously curved within the plane of resonator beam 12, as described in U.S. patent application Ser. No. 14/145,534, which is hereby incorporated by reference in its entirety.

Energy harvester device 10 of the present invention includes mass 22 at second end 18 of resonator beam 12. Mass 22 is provided to lower the frequency of resonator beam 12 and also to increase the power output of resonator beam 12 (i.e., generated by the piezoelectric material). Mass 22 may be constructed of a single material or multiple materials (e.g., layers of materials). According to one embodiment, mass 22 is formed of silicon wafer material. Other suitable materials include, without limitation, copper, gold, and nickel deposited by electroplating or thermal evaporation.

In one embodiment, a single mass 22 is provided per resonator beam 12. However, more than one mass 22 may also be attached to resonator beam 12. In other embodiments, mass 22 is provided, for example, at differing locations along resonator beam 12.

The compliant stopper of the energy harvester device of the present invention may be constructed of a variety of materials. The stopper may be made compliant through material choice, design, or both material choice and design. According to one embodiment, the stopper is made from a material integral to the package. Suitable materials according to this embodiment may include, without limitation, glass, metal, silicon, oxides or nitrides from plasma-enhanced chemical vapor deposition (PECVD), or combinations thereof. According to another embodiment, the stopper is not integral to the package. Suitable materials for the stopper according to this embodiment may include, without limitation, glasses, metals, rubbers and other polymers, ceramics, foams, and combinations thereof. Other suitable materials for the compliant stopper include polymers with low water permeation, such as, but not limited to, cycloolefin polymers and liquid crystal polymers. Liquid crystal polymers can be injection molded.

Energy harvester device 10 of the present invention may be formed in an integrated, self-packaged unit. In particular, package 20, which also forms the base to which first end 16 of resonator beam 12 is attached, is shown to surround the cantilever structure (i.e., resonator beam 12 and mass 22) so that it encloses (at least partially) the cantilever structure. In the present invention, the package can completely enclose the energy harvester device, or can be formed so as to vent the energy harvester device to the atmosphere. When it completely encloses the energy harvester device, the pressure within the enclosed package may be higher, equal to, or lower than atmospheric pressure. In one embodiment, the atmosphere in the enclosed package is less than atmospheric, for example, below 1 Torr.

As those skilled in the art will readily appreciate, resonator beam 12 can be tuned by varying any one or more of a number of parameters, such as the cross-sectional shape of resonator beam 12, cross-sectional dimensions of resonator beam 12, the length of resonator beam 12, the mass of mass 22, the location of mass 22 on resonator beam 12, and the materials used to make resonator beam 12.

In operation, one or more electrodes 24 harvest charge from the piezoelectric material of resonator beam 12 as resonator beam 12 is subject to movement. Accordingly, electrodes 24 are in electrical connection with the piezoelectric material of resonator beam 12.

Electrical energy collected from the piezoelectric material of resonator beam 12 is then communicated to electrical harvesting. In one embodiment, electrical harvesting circuitry is integrated with the energy harvester device. In another embodiment, the electrical harvesting circuitry is not integrated with the energy harvester device. For example, the electrical harvesting circuitry may be a separate chip or board, or is present on a separate chip or board.

Figure 2A:
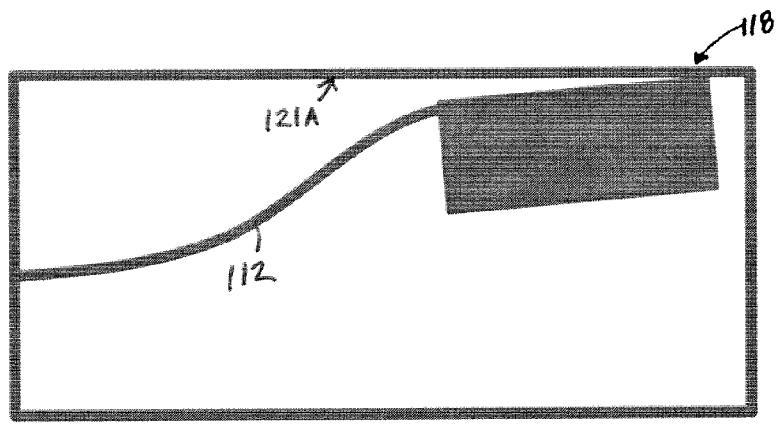
FIGS. 2A-B are side views of energy harvester devices of the prior art.
Figure 2B:
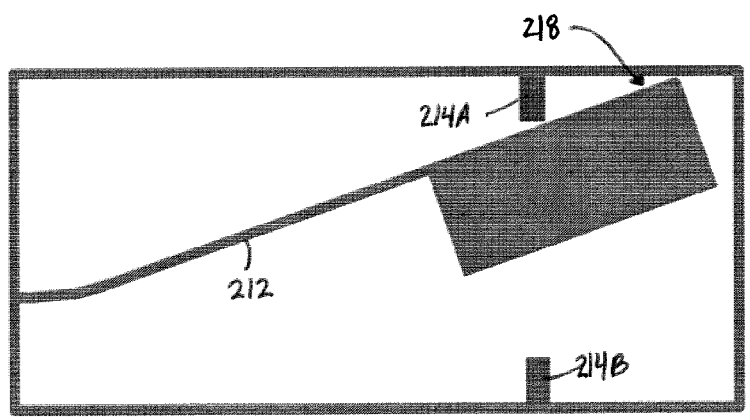

Energy harvester devices of the prior art are illustrated in FIGS. 2A-B. Specifically, in FIG. 2A, the energy harvester device has no stopper structure on interior walls of the package. Consequently, the cantilever structure (end 118 of resonator beam 112) contacts interior wall 121A of the package enclosing the resonator beam during deflection, which results in deformation of cantilever 112. This type of deformation can lead to breakage of cantilever 112. In FIG. 2B, the energy harvester device includes stopper structures 214A and 214B on two opposing interior walls of the package. However, stopper structures 214A and 214B are formed of a rigid, non-compliant material which experience no deformation in shape (compliance) upon contact with resonator beam 212 (at second end 218).

FIGS. 3A-B illustrate the G-acceleration profile (FIG. 3B) of the cantilever structure of the energy harvester device of the prior art shown in FIG. 2A. As illustrated in FIG. 3A, the cantilever (resonator beam 212) contacts stopper 214A positioned on an interior wall of the package. Stopper 214A has minimal or no compliance (i.e., is rigid), which accounts for the high and narrow peak illustrated in the G-acceleration versus time curve of FIG. 3B.

In contrast, the G-acceleration profile of one embodiment of an energy harvester device of the present invention is shown in FIGS. 4A-B. In particular, energy harvester device 10, which has resonator beam 12 having first end 16 and second end 18 contacts compliant stopper 14A positioned on interior wall 21A of package 20. Compliant stopper 14A is compliant by being constructed of a compliant material or being able to adjust its position when contacted by second end 18 of resonator beam 12. The compliance of stopper 14A is reflected in the relatively lower and broader peak of the G-acceleration versus time curve of FIG. 4B (compared to FIG. 3B).

In one embodiment, the G-acceleration profile is taken into account in choosing the particular material and design of the compliant stopper so as to adjust the pulse width of the impact and, subsequently, the acceleration level experienced by the resonator beam (or mass) on impact with the package. This lowering of the experienced acceleration will lead to even greater robustness of the packaged energy harvester device of the present invention, particularly when packaged in a low pressure environment.

Compliant stoppers for use in the energy harvester device of the present invention can take several forms. For example, they can be inserts placed in the package or they can be integral to the package. Modification of the acceleration experienced by the harvester can be realized through design of the stopper alone, or through appropriate choice of a material. The latter is particularly useful when the stopper is placed as an insert in the package.

Figure 5:
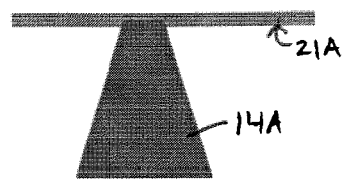
FIG. 5 illustrates a side view of one embodiment of a compliant stopper for use in an energy harvester device of the present invention. The compliant stopper is in the form of a post and may be formed on (e.g., opposing) interior walls of a package containing a piezoelectric cantilever structure.
Figure 7:
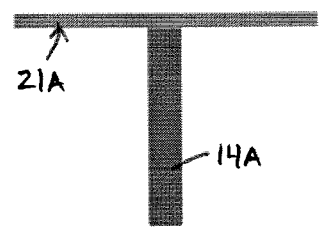
FIG. 7 illustrates a side view of one embodiment of a compliant stopper for use in an energy harvester device of the present invention. The compliant stopper is in the form of a post or other design as illustrated in the front views of FIGS. 8A-E and may be formed on (e.g., opposing) interior walls of a package containing a piezoelectric cantilever structure.

Various non-limiting embodiments of compliant stopper designs are illustrated in FIGS. 5-14. In FIG. 5 and FIG. 7, side views of two different embodiments of compliant stoppers 14A in the form of posts are illustrated. In FIG. 5, stopper 14A is narrower at one end (i.e., its attachment point to interior wall 21A of a package) than the end that comes into contact with the cantilever. In FIG. 7, stopper 14A is a high aspect ratio feature, having a height:width of at least about 2:1.

Figure 6A:
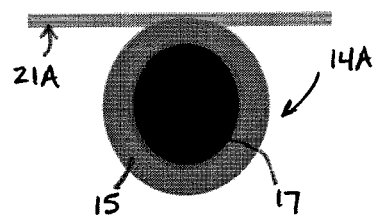
FIGS. 6A-B illustrate side views of two different embodiments of compliant stoppers for use in an energy harvester device of the present invention. The compliant stoppers are in the form of a sphere (FIG. 6A) and hemisphere (FIG. 6B) and may be formed on (e.g., opposing) interior walls of a package containing a piezoelectric cantilever structure. Alternatively.
Figure 6B:
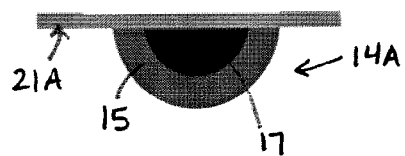

In FIGS. 6A-B, two different embodiments of compliant stopper 14A in the form of a sphere (FIG. 6A) and hemisphere (FIG. 6B) are illustrated in side view. Compliant stopper 14A could, according to other embodiments, be in the form of a cylinder, rod, or partial cylinder (i.e., partial cylinder). According to the particular embodiments illustrated in FIGS. 6A and 6B, stoppers 14A are constructed of two materials, including core 17 and outer covering 15, which may or may not be the same material, and which are used to adjust the compliant properties of stoppers 14A.

Figure 8A:
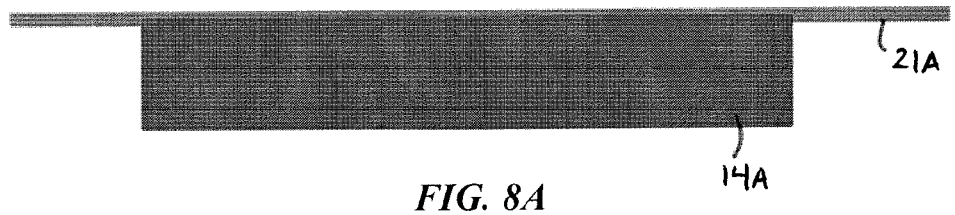
FIGS. 8A-E illustrate front views of five different embodiments of compliant stoppers for use in an energy harvester device of the present invention. These particular embodiments of compliant stoppers may or may not have the side view profile of the compliant stopper illustrated in FIG. 7. The compliant stoppers are in the form of a compliant strip (FIG. 8A), compliant suspended strips (FIGS. 8B, 8D, and 8E), compliant dual formations (FIG. 8C) and may be formed on (e.g., opposing) interior walls of a package containing a piezoelectric cantilever structure.
Figure 8B:
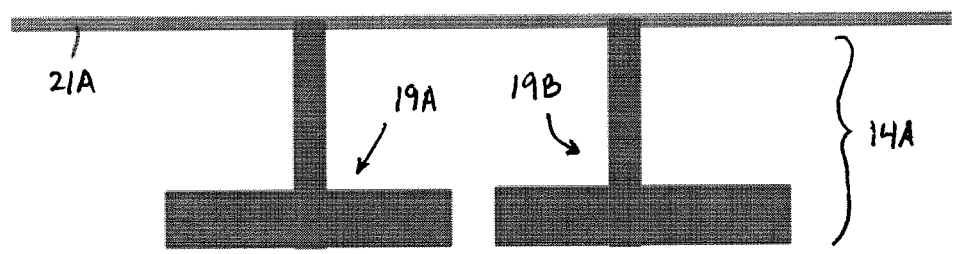
Figure 8C:

In FIGS. 8A-E, front views of five different embodiments of compliant stopper 14A are shown. Specifically, compliant stopper 14A in FIG. 8A is in the form of a compliant strip attached to inner wall 21A. Compliant stopper 14A in FIG. 8B is in the form of dual compliant suspended strips 19A and 19B attached to inner wall 21A. According to one embodiment, dual compliant suspended strips may be constructed of a single material or multiple materials. In one embodiment, suspended strip 19A and/or suspended strip 19B is constructed of two materials, including one material for the suspended vertical posts and another material for the horizontal strips. Compliant stopper 14A in FIG. 8C is in the form of dual formations attached to inner wall 21A.

Figure 8D:
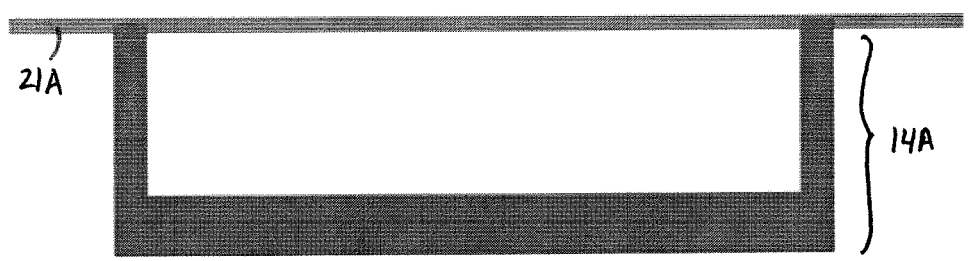
Figure 8E:
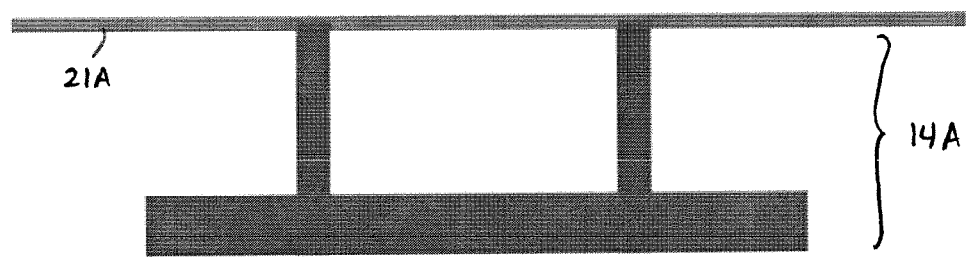

In FIGS. 8D-E two different embodiments of compliant stopper 14A are shown in the form of compliant suspended beams attached to inner wall 21A. Stoppers 14A in both FIG. 8D and FIG. 8E may be constructed of a single or multiple materials to adjust the amount of compliance desired. According to one embodiment, the entirety of stopper 14A in either FIG. 8D or FIG. 8E is formed of a compliant material. According to another embodiment, only a portion of stopper 14A in FIG. 8D or FIG. 8E is formed of a compliant material. For example, the horizontal beam may be a rigid material while one or both of the vertical posts suspending the horizontal beam is formed of a compliant material, or vice versa.

Figure 9A:
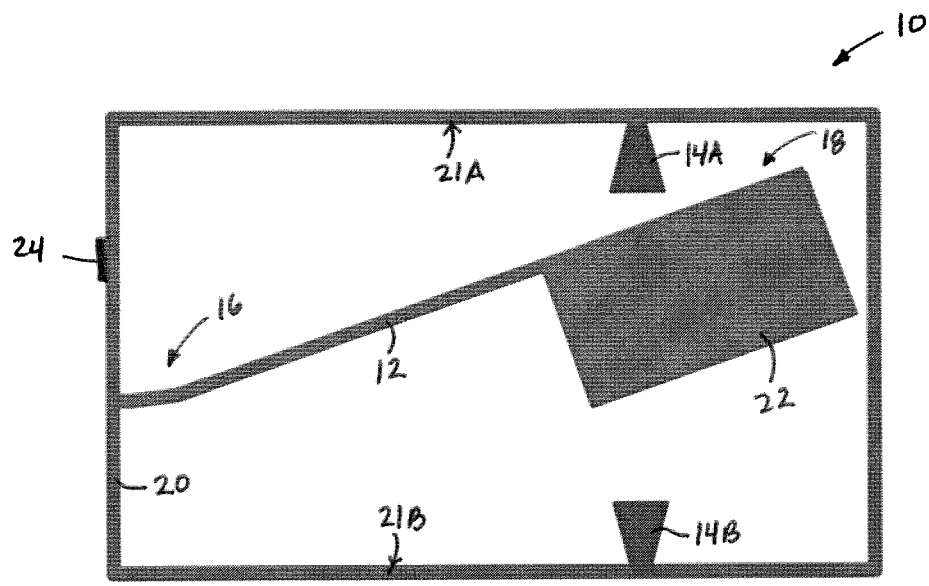
FIGS. 9A-B illustrate one embodiment of the energy harvester device of the present invention which includes two compliant stoppers in the form of posts formed perpendicular to a resting resonator beam. The two compliant stoppers are connected to the package on opposing interior walls. The compliant stoppers are configured to stabilize motion of the cantilever to prevent breakage and/or deformation of the cantilever.
Figure 9B:
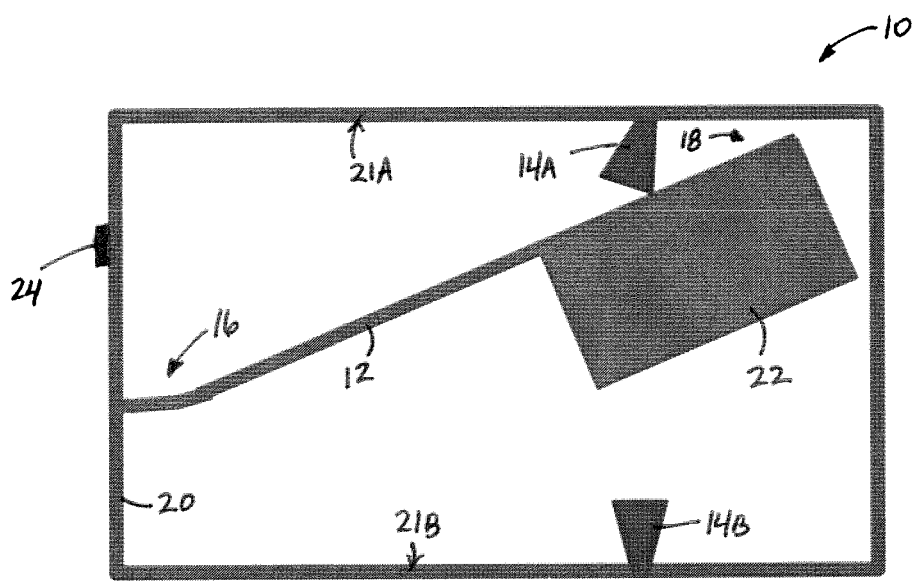

One embodiment of the energy harvester device of the present invention is illustrated in FIGS. 9A-B. In particular, in FIG. 9A, energy harvester device 10 includes resonator beam 12 comprising a piezoelectric material. Resonator beam 12 extends between first end 16 of resonator beam 12 and second end 18 of resonator beam 12. Base 20, which also forms a package surrounding second end 18 of resonator beam 12, is connected to resonator beam 12 at first end 16 with second end 18 being freely extending from base 20 as a cantilever. Energy harvester device 10 also includes mass 22 attached to second end 18 of resonator beam 12. Compliant stoppers 14A and 14B are formed on interior walls 21A and 21B, respectively, of package 20. FIG. 9B illustrates the interaction of the cantilever structure (specifically, second end 18 of resonator beam 18) with compliant stopper 14A. Specifically, second end 18 of resonator beam 12 bends upward far enough to come into contact with compliant stopper 14A, upon which compliant stopper 14A is shown to adjust its perpendicular position relative to interior wall 21A in response to contact with second end 18 of resonator beam 12. Thus, compliant stopper 14A prevents any contact of resonator beam 12 with any other portions of package 20 (particularly inner wall 21A), and also changes the G acceleration profile experienced by energy harvester device 10 (see FIGS. 3A-B and 4A-B). In like manner, compliant stopper 14B would prevent any contact of resonator beam 12 (and mass 22) with any other portions of package 20 (particularly inner wall 21B opposite of inner wall 21A). The interaction of the cantilever with stoppers 14A and 14B stabilizes the motion of resonator beam 12 and prevents deformation and/or breakage of resonator beam 12 during vibration.

Figure 10A:
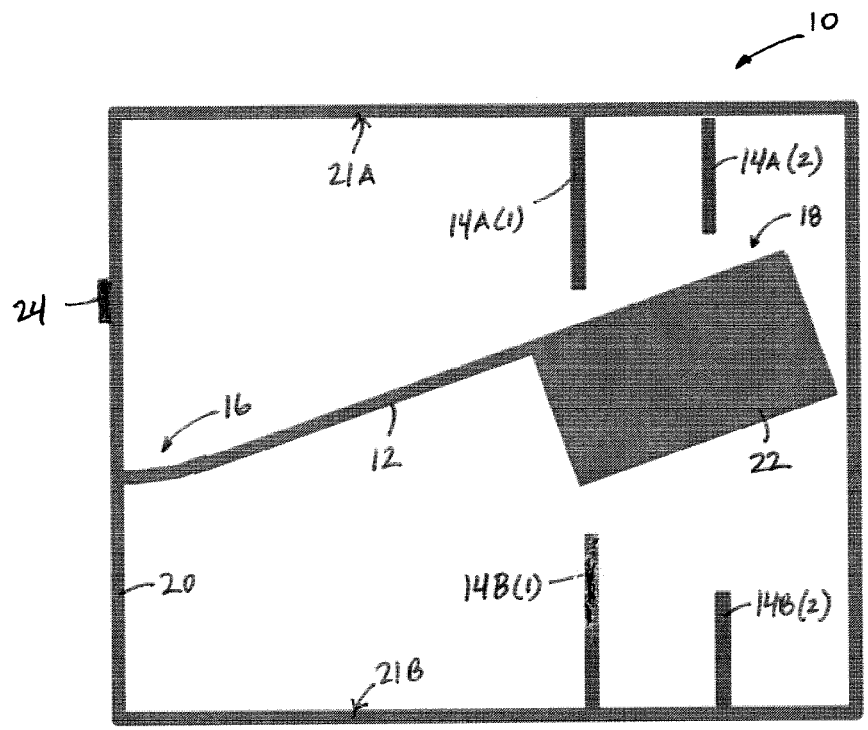
FIGS. 10A-B illustrate one embodiment of the energy harvester device of the present invention which includes compliant stoppers in the form of uneven dual posts. The compliant stoppers are connected to the package on opposing interior walls and are configured to stabilize motion of the cantilever to prevent breakage and/or deformation of the cantilever.
Figure 10B:
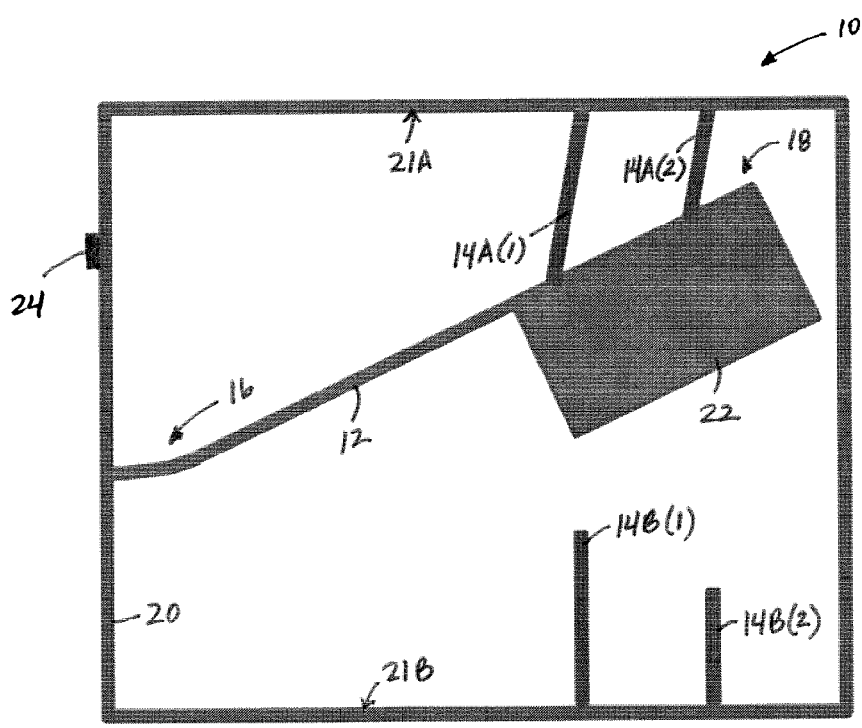

Another embodiment of the energy harvester device of the present invention is illustrated in FIGS. 10A-B. In particular, in FIG. 10A, energy harvester device 10 includes resonator beam 12 comprising a piezoelectric material. Resonator beam 12 extends between first end 16 of resonator beam 12 and second end 18 of resonator beam 12. Base 20, which also forms a package surrounding second 18 of resonator beam 12, is connected to resonator beam 12 at first end 16 with second end 18 being freely extending from base 20 as a cantilever. Energy harvester device 10 also includes mass 22 attached to second end 18 of resonator beam 12. Compliant stoppers 14A(1) and 14A(2), and 14B(1) and 14B(2), are formed on interior walls 21A and 21B, respectively, of package 20. FIG. 10B illustrates the interaction of the cantilever structure (specifically, second end 18 of resonator beam 18) with compliant stoppers 14A(1) and 14A(2). Specifically, second end 18 of resonator beam 12 bends upward far enough to come into contact with compliant stoppers 14A(1) and 14A(2), upon which compliant stoppers 14A(1) and 14A(2) are shown to adjust their perpendicular position relative to interior wall 21A in response to contact with second end 18 of resonator beam 12. Thus, compliant stoppers 14A(1) and 14A(2) prevent any contact of resonator beam 12 with any other portions of package 20 (particularly inner wall 21A), and also changes the G acceleration profile experienced by energy harvester device 10 (see FIGS. 3A-B and 4A-B). In like manner, compliant stoppers 14B(1) and 14B(2) would prevent any contact of resonator beam 12 (and mass 22) with any other portions of package 20 (particularly inner wall 21B opposite of inner wall 21A). The interaction of the cantilever with stoppers 14A(1) and 14A(2), and 14B(1) and 14B(2), stabilizes the motion of resonator beam 12 and prevents deformation and/or breakage of resonator beam 12 during vibration.

Figure 11A:
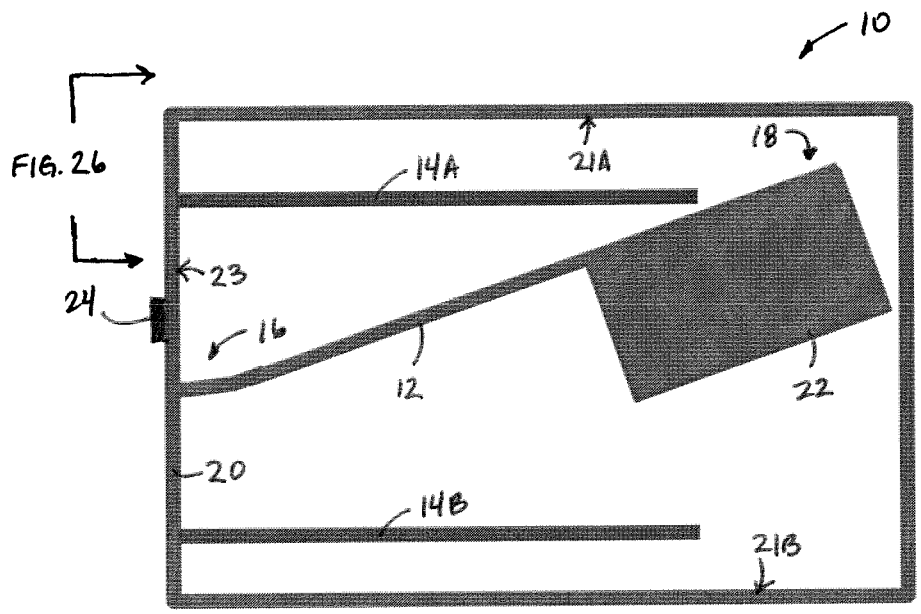
FIGS. 11A-B illustrate one embodiment of the energy harvester device of the present invention which includes two compliant stoppers in the form of beams formed parallel to the resting resonator beam. The compliant stoppers are connected to the package on one of the interior walls of the package. One of the compliant stoppers is connected to the package above the resonator beam and the other compliant stopper is connected to the package below the resonator beam. The compliant stoppers are configured to stabilize motion of the cantilever to prevent breakage and/or deformation of the cantilever.
Figure 11B:
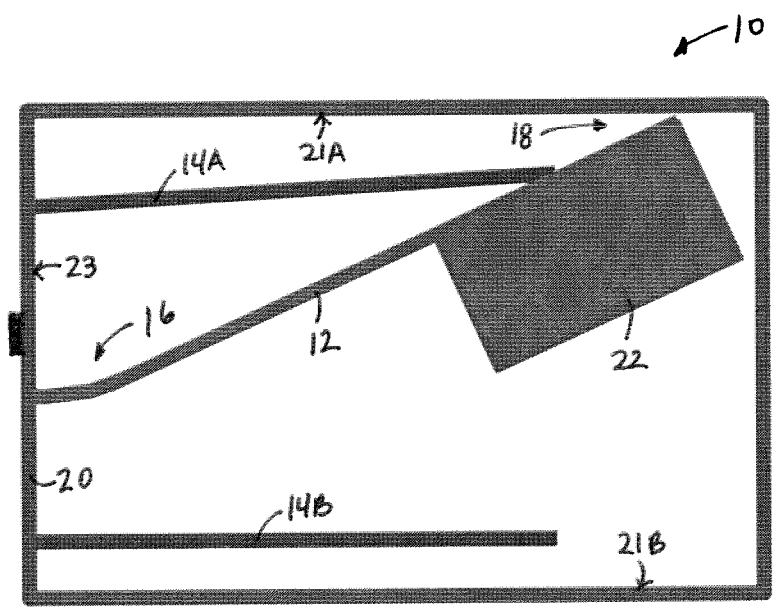

Yet another embodiment of the energy harvester device of the present invention is illustrated in FIGS. 11A-B. In particular, in FIG. 11A, energy harvester device 10 includes resonator beam 12 comprising a piezoelectric material. Resonator beam 12 extends between first end 16 of resonator beam 12 and second end 18 of resonator beam 12. Base 20, which also forms a package surrounding second 18 of resonator beam 12, is connected to resonator beam 12 at first end 16 with second end 18 being freely extending from base 20 as a cantilever. Energy harvester device 10 also includes mass 22 attached to second end 18 of resonator beam 12. Compliant stoppers 14A and 14B, are formed on interior wall 23 of package 20. In particular, compliant stopper 14A is shown to be positioned above resonator beam 12 on interior wall 23 and compliant stopper 14B is shown to be positioned below resonator beam 12 on interior wall 23. Unlike the embodiments illustrated in, e.g., FIGS. 9A-B and 10A-B, no compliant stopper is formed on opposing interior walls 21A and 21B of package 20 in the particular embodiment of the energy harvester device of the present invention shown in FIGS. 11A-B. FIG. 11B illustrates the interaction of the cantilever structure (specifically, second end 18 of resonator beam 18) with compliant stopper 14A. Specifically, second end 18 of resonator beam 12 bends upward far enough to come into contact with compliant stopper 14A, upon which compliant stopper 14A is shown to adjust its perpendicular position to interior wall 23 in response to contact with resonator beam 12. Thus, compliant stopper 14A prevents any contact of resonator beam 12 with any other portions of package 20 (particularly inner wall 21A), and also changes the G acceleration profile experienced by energy harvester device 10 (see FIGS. 3A-B and 4 A-B). In like manner, compliant stopper 14B would prevent any contact of resonator beam 12 (and mass 22) with any other portions of package 20 (particularly inner wall 21B opposite of inner wall 21A). The interaction of the cantilever with stoppers 14A and 14B, stabilizes the motion of resonator beam 12 and prevents deformation and/or breakage of resonator beam 12 during vibration.

Figure 12A:
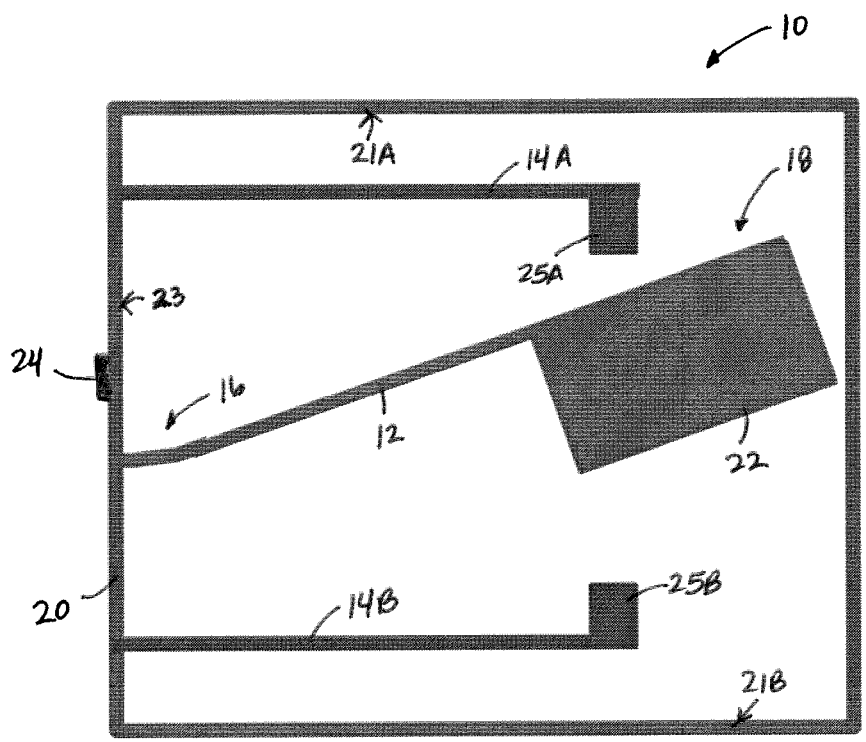
FIGS. 12A-B illustrate one embodiment of the energy harvester device of the present invention which includes two compliant stoppers in the form of beams formed parallel to a resting resonator beam. The compliant stoppers are connected to the package on one of the interior walls of the package. One of the compliant stoppers is connected to the package above the resonator beam and the other compliant stopper is connected to the package below the resonator beam. The compliant stoppers are configured to stabilize motion of the cantilever to prevent breakage and/or deformation of the cantilever.
Figure 12B:
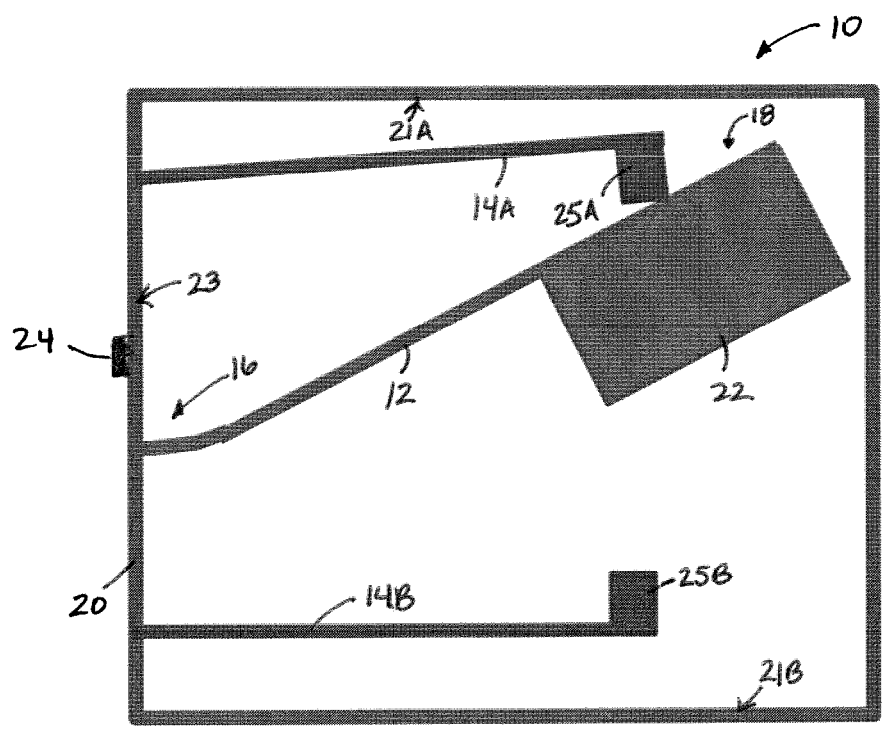

A further embodiment of the energy harvester device of the present invention is illustrated in FIGS. 12A-B. In particular, in FIG. 12A, energy harvester device 10 includes resonator beam 12 comprising a piezoelectric material. Resonator beam 12 extends between first end 16 of resonator beam 12 and second end 18 of resonator beam 12. Base 20, which also forms a package surrounding second 18 of resonator beam 12, is connected to resonator beam 12 at first end 16 with second end 18 being freely extending from base 20 as a cantilever. Energy harvester device 10 also includes mass 22 attached to second end 18 of resonator beam 12. Compliant stoppers 14A and 14B, are formed on interior wall 23 of package 20. In particular, compliant stopper 14A is shown to be positioned above resonator beam 12 on interior wall 23 with portion 25A formed towards resonator beam 12 and compliant stopper 14B is shown to be positioned below resonator beam 12 on interior wall 23 with portion 25A formed towards resonator beam 12. FIG. 12B illustrates the interaction of the cantilever structure (specifically, second end 18 of resonator beam 18) with compliant stopper 14A. Specifically, second end 18 of resonator beam 12 bends upward far enough to come into contact with portion 25A of compliant stopper 14A, upon which compliant stopper 14A is shown to adjust its perpendicular position to interior wall 23 in response to contact with resonator beam 12. Thus, compliant stopper 14A prevents any contact of resonator beam 12 with any other portions of package 20 (particularly inner wall 21A). In like manner, compliant stopper 14B would prevent any contact of resonator beam 12 (and mass 22) with any other portions of package 20 (particularly inner wall 21B opposite of inner wall 21A), and also changes the G acceleration profile experienced by energy harvester device 10 (see FIGS. 3A-B and 4A-B). The interaction of the cantilever with portions 25A and 25B of compliant stoppers 14A and 14B, respectively, stabilizes the motion of resonator beam 12 and prevents deformation and/or breakage of resonator beam 12 during vibration.

Figure 13A:
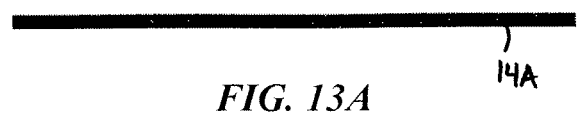
FIGS. 13A-C illustrate various embodiments of compliant stoppers that may be used in the particular embodiments of energy harvester devices of the present invention illustrated in FIGS. 11A-B and 12A-B.
Figure 13B:
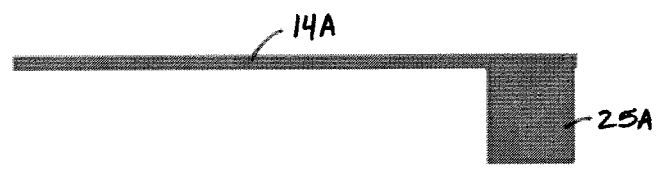
Figure 13C:

As illustrated in the particular embodiments of energy harvester devices 10 shown in FIGS. 11A-B and FIGS. 12A-B, compliant stoppers may be formed on the package parallel to a resting cantilever. Various embodiments of compliant stoppers according to this embodiment are illustrated in FIGS. 13A-C. FIG. 13A is a compliant stopper formed as a straight beam. In FIGS. 13B-C, portions 25A are formed on compliant stopper 14A. FIG. 13C is the front view of the compliant stopper of FIG. 13B, which is the side view. Portions 25A may be constructed of the same or different material from that used in compliant stopper 14A.

Figure 14A:
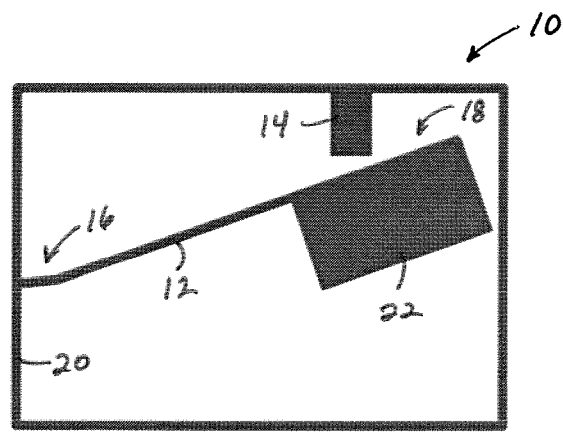
FIGS. 14A-C illustrate various embodiments of the energy harvester device of the present invention which includes a compliant stopper in the form of a post. In each of the embodiments illustrated in FIGS. 14A-C, the compliant stopper is connected to the package on an interior wall.
Figure 14B:
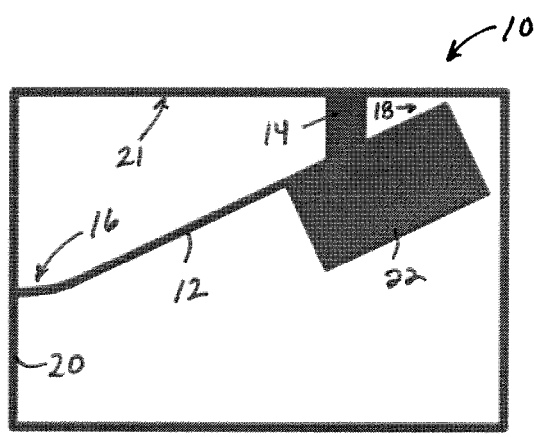

FIGS. 14A and 14B illustrate one embodiment of the energy harvester device of the present invention which incorporate compliant material in its compliant stopper. In particular, in FIGS. 14A-B, energy harvester device 10 includes resonator beam 12 comprising a piezoelectric material and having a first end 16 and second end 18. Base 20, formed as package 20, is connected to resonator beam 12 at first end 16, with second end 18 being freely extending from base 20 as a cantilever. Mass 22 is attached to second end 18 of resonator beam 12. Package 20 surrounds resonator beam 12. Compliant stopper 14 (in the form of a post) is formed on interior wall 21 of package 20. Compliant stopper 14 is constructed of a compliant material that deforms upon contact with resonator beam 12 to stabilize motion of the cantilever to prevent breakage and/or deformation of the cantilever, and to change the G acceleration profile experienced by energy harvester device 10 (see FIGS. 3A-B and 4A-B). FIG. 14A shows energy harvester device 10 before the cantilever impacts compliant stopper 14 and FIG. 14B shows energy harvester device 10 after the cantilever impacts compliant stopper 14. Rather than adjusting its position relative to interior wall 21, compliant stopper 14 absorbs the impact of the cantilever.

Figure 14C:
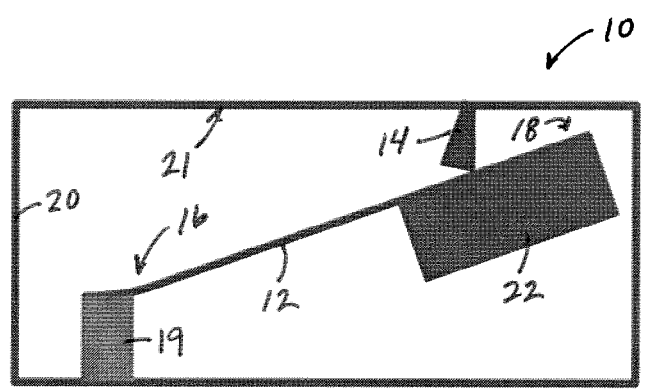

FIG. 14C illustrates alternative embodiments for compliant stopper 14 and base/package 20, compared to FIGS. 14A-B. In particular, in FIG. 14C, compliant stopper 14, when it comes into contact with resonator beam 12, is displaced slightly to give a compliant response. In addition, first end 16 resonator beam 12 is attached to base 19, which is a separate structure from, but still connect to, package 20.

According to one embodiment of the energy harvester device of the present invention, at least one compliant stopper is incorporated on one interior wall of the package. More often, more than one compliant stopper will be included on the packaging of the energy harvester device of the present invention. Typically, at a minimum two compliant stoppers are included so that the cantilever structure contacts one compliant stopper as the cantilever rises during vibration and another compliant stopper as the cantilever lowers during vibration. More than one compliant stopper can be used and the compliant stoppers can be configured to contact the resonator beam and/or the mass in more than one location in the direction of the cantilever length. When more than one compliant stopper is used in a single energy harvester device (e.g., a compliant stopper on a top wall and a compliant stopper on a bottom wall), the compliant stoppers do not have to be constructed of the same material, nor do they have to have the same geometrical structure.

Figure 15:
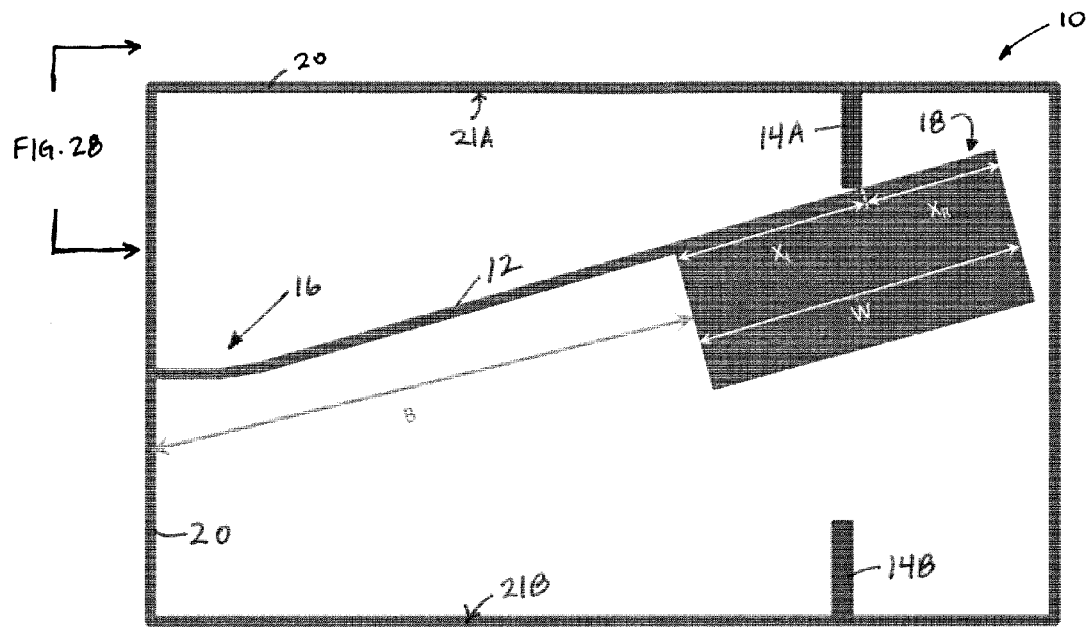
FIG. 15 is a side view of one embodiment of the energy harvester device of the present invention which includes two compliant stoppers in the form of posts formed perpendicular to a resting resonator beam. The compliant stoppers are connected to the package on opposing interior walls. Markings on the illustration demonstrate mathematical considerations for compliant stopper positioning on the package walls for optimizing torque balance of the piezoelectric cantilever according to the formula $$X_L \cong \left(\frac{3B+2W}{6B+3W}\right)W.$$

According to one embodiment, in designing the energy harvester device of the present invention, the compliant stopper is placed such that it makes contact with the mass at a point such that the torque on the entire cantilever+mass beam is equal to zero. For example, as illustrated in FIG. 15, markings on energy harvester device 10 illustrate stopper positioning on the package walls for optimizing torque balance according to the formula $$X_L \cong \left(\frac{3B+2W}{6B+3W}\right)W.$$

According to one embodiment, $X_L$ is the point on the mass of the cantilever at which the compliant stopper makes contact with the mass. Thus, according to one embodiment, $X_L$ is the torque neutral position for a single point of contact of the cantilever with the compliant stopper. If the compliant stopper contacts the cantilever at the torque neutral position, the movement of the energy harvester device due to the contact is diminished considerably, resulting in more robust cantilever movement.

Another aspect of the present invention relates to a system comprising an electrically powered apparatus and the energy harvester device of the present invention electrically coupled to the electrically powered apparatus.

Figure 16:
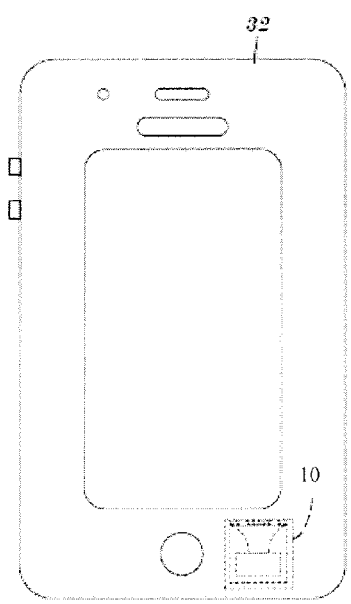
FIG. 16 illustrates one embodiment of a system of the present invention which includes an electrically powered smart phone containing an energy harvester device of the present invention which is electrically coupled to the smart phone to provide electrical energy to power the smart phone.

Turning now to FIG. 16, electrically powered apparatus (smartphone) 32 is shown to contain (within its exterior housing) energy harvester device 10. According to this embodiment, energy harvester device 10 provides a stand-alone source of energy to power smartphone 32, which is used in place of or in conjunction with another standalone energy source (e.g., a battery). In an alternative embodiment, the electrically powered apparatus is, e.g., a wearable device, such as a wrist watch-type device or necklace that electronically communicates with a tablet, PC, and/or smartphone.

The energy harvester device of the present invention may also power an electrically powered apparatus by charging a battery associated with the electrically powered apparatus. For example, the energy harvester device may provide a trickle charge to a battery which powers the electrically powered apparatus.

Other systems of the present invention that include an electrically powered apparatus and the energy harvester device of the present invention include, without limitation, a laptop computer; a tablet computer; a cell phone; an e-reader; an MP3 player; a telephony headset; headphones; a router; a gaming device; a gaming controller; a mobile internet adapter; a camera; wireless sensors; wearable sensors that communicate with tablets, PCs, and/or smartphones; wireless sensor motes (for networks monitoring industrial, rail, buildings, agriculture, etc.); tire pressure sensor monitors; electronic displays (e.g., on power tools); agriculture devices for monitoring livestock; medical devices; human body monitoring devices; and toys.

For example, according to one embodiment, the system of the present invention is a wireless sensor device containing a sensor to monitor, e.g., any one or more various environmental properties (temperature, humidity, light, sound, vibration, wind, movement, etc.). The energy harvester device of the present invention is coupled to the sensor to provide power to the sensor.

According to one example, the system of the present invention is a tire-pressure monitoring system containing a sensor to monitor tire pressure. The energy harvester device of the present invention is coupled to the sensor to provide power. Such a system may be formed as a small device mounted, e.g., on a wheel or tire of an automobile.

According to another example, the system of the present invention is a humidity sensor in communication with electronic controls of a household or commercial clothes drier. The energy harvester device of the present invention is coupled to the sensor to provide power. Such a system may be formed as a small device mounted, e.g., on the inside of a clothes drier to monitor the dryness of clothes based on humidity levels in the clothes drier. Alternatively, the device is not mounted on the inside of a clothes drier, but is, e.g., a device that can be tossed into the drier with clothes (e.g., a ball). The sensor could then communicate with the electronic controls of the clothes drier to determine, e.g., the end of a cycle.

A further aspect of the present invention relates to a method of powering an electrically powered apparatus. This method involves providing the system of the present invention; subjecting the system to movement or vibrations to generate electrical energy from the piezoelectric material; and transferring the electrical energy from the piezoelectric material to the apparatus to provide power to the apparatus.

Energy harvester devices of the present invention may be made in accordance with the methods set forth in the following description. According to one embodiment, a method of producing an energy harvester device involves providing a silicon wafer having a first and second surface; depositing a first silicon dioxide ($SiO_2$) layer on the first surface of the silicon wafer; depositing a cantilever material on the first silicon dioxide layer; depositing a second silicon dioxide layer on the cantilever material; depositing a piezoelectric stack layer on the second silicon dioxide layer; patterning the piezoelectric stack layer; patterning the second silicon dioxide layer, the cantilever material, and the first silicon dioxide layer; and etching the second surface of the silicon wafer to produce the energy harvester device.

According to one embodiment, this method may further involve depositing a third silicon dioxide layer over the patterned piezoelectric stack layer and the patterned second silicon dioxide layer, cantilever material, and first silicon dioxide layer and patterning the third silicon dioxide layer. According to another embodiment, the method of the present invention may further involve depositing a metal bondpad layer over the patterned third silicon dioxide layer and patterning the metal bondpad layer.

Figure 17:
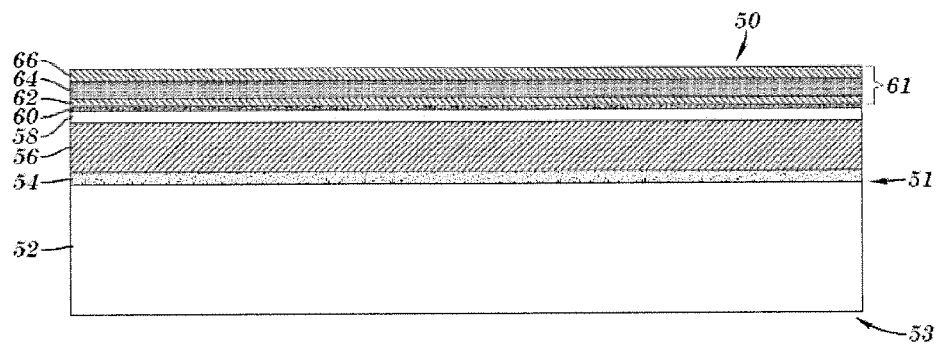
FIG. 17 is a side view of a layered material stack for producing one embodiment of an energy harvester device of the present invention. The layered material stack includes a silicon wafer, a first silicon dioxide layer, a cantilever material, a second silicon dioxide layer, an optional adhesion layer, a first metal layer, a piezoelectric material layer, and a second metal layer.

With reference now to FIG. 17, one embodiment of the method of producing the energy harvester device of the present invention involves forming layered material stack 50, which is a stack of layered materials that is patterned to form an energy harvester device as described herein. Layered material stack 50 includes the following layered materials: silicon wafer 52 (which has first surface 51 and second surface 53), first silicon dioxide layer 54, cantilever material 56, second silicon dioxide layer 58, adhesion layer 60 (which is optional), and piezoelectric stack layer 61 (comprising first metal layer 62, piezoelectric material layer 64, and second metal layer 66).

As illustrated in FIG. 17, the method of forming the energy harvester device of the present invention involves forming layered material stack 50 by providing silicon wafer 52 having first surface 51 and second surface 53, depositing first silicon dioxide layer 54 on first surface 51 of silicon wafer 52, depositing cantilever material 56 on first silicon dioxide layer 54, depositing second silicon dioxide layer 58 on cantilever material 56, depositing optional adhesion layer 60 on second silicon dioxide layer 58, and depositing piezoelectric stack layer 61 on second silicon dioxide layer 58.

Silicon wafer 52 is, according to one embodiment, a single crystal double-sided polished silicon wafer. In one embodiment, silicon wafer 52 has a thickness of about 400 μm to about 1,000 μm, about 500 μm to about 900 μm, about 600 μm to about 800 μm, or about 700 μm. In one specific example, silicon wafer 52 is a double-sided polished silicon wafer having a thickness of approximately 725 μm (+/−15 μm) (i.e., the standard thickness for 200 mm wafers). Alternatively, in place of silicon wafer 52, the method of the present invention may begin with a deposited layer of silicon dioxide upon which the subsequent layers of layered material stack 50 are formed.

First silicon dioxide layer 54 is, according to one embodiment, a thermal oxide layer. Silicon dioxide layer 54 provides an etch stop for the backside etch stop that releases cantilever material 56 and, when the mass is made of silicon, also defines the mass. In one embodiment, first silicon dioxide layer 54 has a thickness of about 0.25 μm to about 2 μm. Deposition of first silicon dioxide layer 54 onto silicon wafer 52 can be carried out by methods known in the art. For example, silicon dioxide may be thermally grown and then deposited on the silicon wafer. In one particular example, one (1) μm (+/−0.05 μm) of thermally grown $SiO_2$ is deposited onto silicon wafer 52 to form silicon dioxide layer 54.

Cantilever material 56 may be any suitable material such as silicon, polySi, metal (e.g., Cu or Ni), or other metal oxide semiconductor (CMOS) compatible material, or a high temperature polymer such as polyimide. In one embodiment, cantilever material 56 is deposited on first silicon dioxide layer 54 by chemical vapor deposition at a thickness range of about 10 μm to about 200 μm, about 10 μm to about 75 μm, or about 10 μm to about 50 μm. Following deposition, it may be desirable to smooth the surface of cantilever material 56, e.g., by chemical mechanical polish.

Second silicon dioxide layer 58 is, according to one embodiment, a high temperature oxide layer. This layer provides a surface upon which piezoelectric stack layer 61 can adhere well to, as well as an etch stop for patterning a bottom electrode of piezoelectric stack layer 61. In one embodiment, second silicon dioxide layer 58 is deposited onto cantilever material 56 by chemical vapor deposition at a thickness of about 1 μm.

Piezoelectric stack layer 61 is deposited onto second silicon dioxide layer 58 to form a metal/piezoelectric material/metal layer. According to one embodiment, piezoelectric stack layer 61 has a thickness of about 0.5 μm to about 6 μm, or about 2 μm to about 5 μm in thickness. First metal layer 62 and second metal layer 66 may be formed of any suitable metals that adequately function as an electrode. According to one embodiment, these layers are formed of the same material, such as molybdenum or platinum. However, both layers need not be formed of the same material. Piezoelectric material layer 64 is formed of any suitable piezoelectric material, as discussed above. According to one embodiment, this layer is formed of aluminum nitride (AlN).

Deposition of piezoelectric stack layer 61 may be carried out with thin adhesion layer 60 underneath as is standard in the art. Suitable adhesion layers 60 may include materials such as titanium, AlN, Al:Cu, or Al at a layer thickness of about 0.02 μm to about 0.05 μm.

Figure 18:
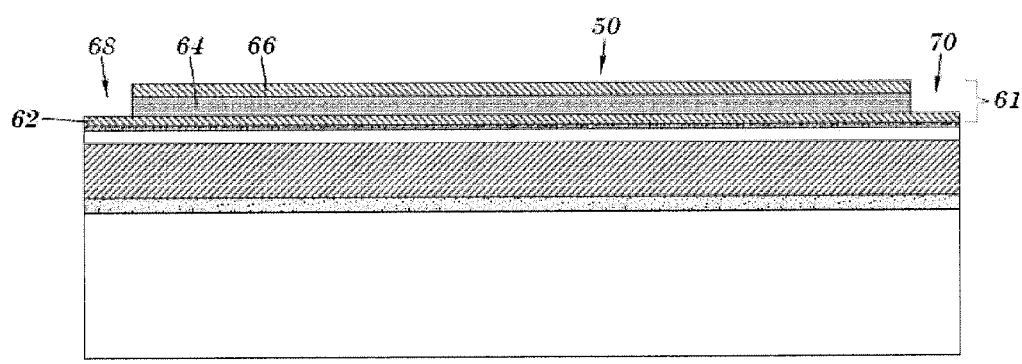
FIG. 18 is a side view of the layered material stack of FIG. 17, which has been patterned, according to one embodiment of a method of producing an energy harvester device of the present invention, to remove portions of the piezoelectric material layer and metal layer(s) from the layered material stack.
Figure 19:
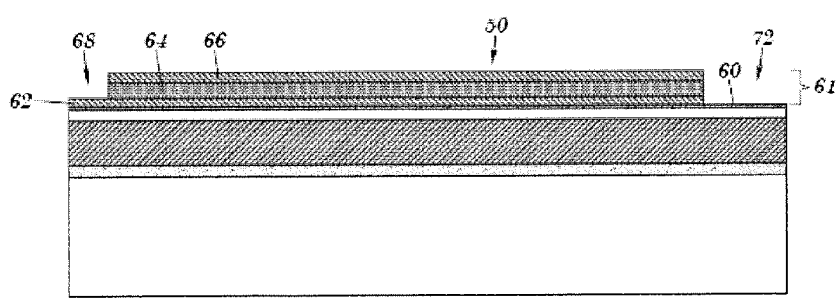
FIG. 19 is a side view of the layered material stack of FIG. 18, in which the first metal layer is patterned to remove a portion thereof from the layered material stack.

One embodiment of the method of making an energy harvester device of the present invention proceeds as illustrated in FIGS. 18-25. First, as shown in FIGS. 18-19, piezoelectric stack layer 61 is patterned. In particular, portions (e.g., portions 68 and 70) of piezoelectric material layer 64 and second metal layer 66 are removed from stack 50 to expose first metal layer 62.

Patterning piezoelectric stack layer 61 according to the method of the present invention may be accomplished using lithography techniques combined with wet etch with phosphoric acid for the metal layers and tetramethylamonium-hydroxide. Other suitable chemistries for wet or dry etching of the layers are also commonly used by persons of ordinary skill in the art and may be used in carrying out the method of the present invention.

According to one embodiment, patterning piezoelectric stack layer 61 involves removing portions of second metal layer 66 and piezoelectric material layer 64, and patterning first metal layer 62 to remove a portion thereof (e.g., portion 72) and to leave a further portion thereof exposed as an electrode. Patterning the electrode may be carried out using a phosphoric acid wet etch or a plasma (dry) etch with chlorine or fluorine gas. If an adhesion layer is present, the adhesion layer may be removed with a wet etch based ammonia peroxide (e.g., for a titanium adhesion layer).

Figure 20:
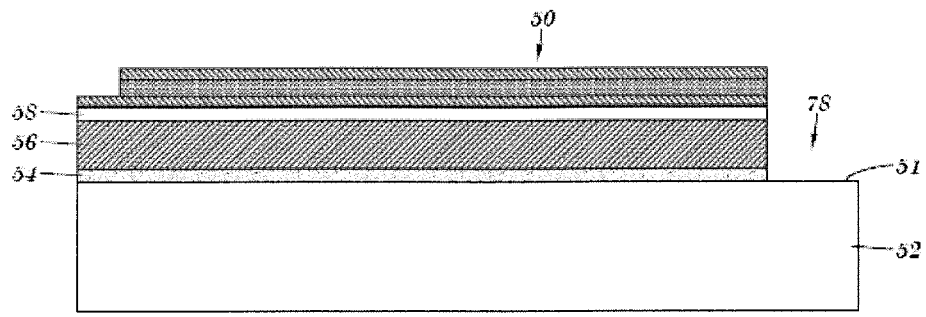
FIG. 20 is a side view of the layered material stack of FIG. 19, which has been further patterned, according to one embodiment of a method of producing an energy harvester device of the present invention, to remove portions of the second silicon dioxide layer, the cantilever material, and the first silicon dioxide layer from the layered material stack.

Next, second silicon dioxide layer 58, cantilever material 56, and first silicon dioxide layer 54 are patterned. This method step is illustrated in FIG. 20. According to one embodiment, patterning silicon dioxide layer 58, cantilever material 56, and first silicon dioxide layer 54 involves removing a portion of second silicon dioxide layer 58, a portion of cantilever material 56, and a portion of first silicon dioxide layer 54 to leave portion 78 of first surface 51 of silicon wafer 52 exposed.

Patterning second silicon dioxide layer 58, cantilever material 56, and first silicon dioxide layer 54 may further involve removing opposing side walls of second silicon dioxide layer 58, cantilever material 56, and first silicon dioxide layer 54 to form a cantilever material layer having side walls.

According to one embodiment, this patterning may be done entirely with dry processes. For example, fluorine $CHF_3/CF_4$ gases and a reactive ion etch for the oxides and $SF_6/C_4F_8$ deep reactive ion etch for the polySi. For a metal, such as Cu, Au, or Ni, a wet etch process well known in the art can be used. Alternatively, the Cu, Ni, or Au are added via electroplating after patterning of the silicon layers.

Figure 21:
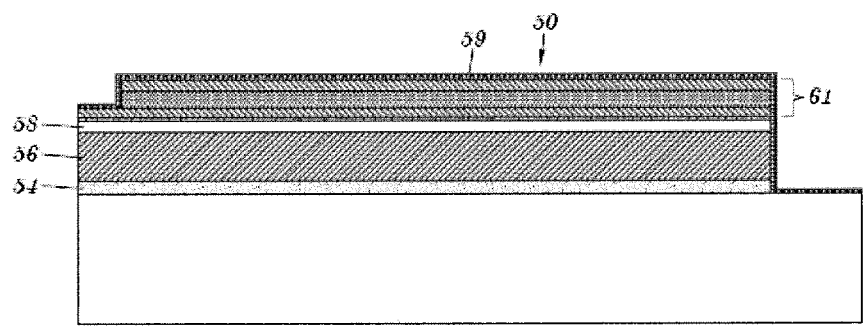
FIG. 21 is a side view of the layered material stack of FIG. 20, in which a third silicon dioxide layer has been deposited over the patterned piezoelectric stack layer and the patterned second silicon dioxide layer, cantilever material, and first silicon dioxide layer.

In a further (optional) method step illustrated in FIG. 21, third silicon dioxide layer 59 is deposited over the patterned piezoelectric stack layer 61 and the patterned second silicon dioxide layer 58, cantilever material 56, and first silicon dioxide layer 54. According to one embodiment, this step is carried out using plasma-enhanced chemical vapor deposition of silane (a silicon source) to deposit silicon for the passivation layer. This layer may be deposited to a thickness of about 1 μm. According to another embodiment, depositing the third silicon dioxide layer is an optional step that provides robustness to the structure against abrasion.

Figure 22:
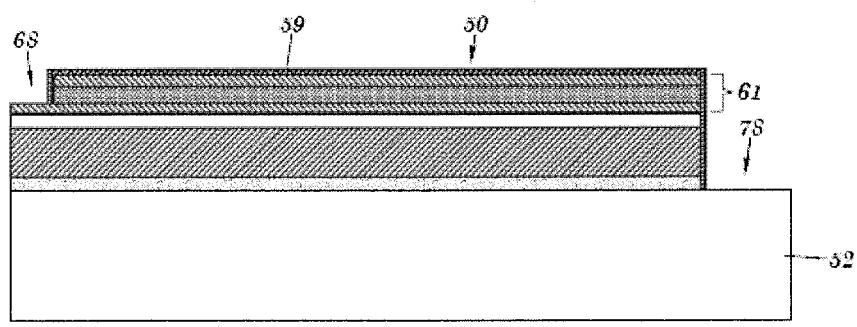
FIG. 22 is a side view of the layered material stack of FIG. 20, which has been patterned, according to one embodiment of the method of producing an energy harvesting device of the present invention, to remove a portion of the third silicon dioxide layer to leave a portion of the piezoelectric stack and a portion of the silicon wafer exposed.

In the next method step illustrated in FIG. 22, when present, third silicon dioxide layer 59 is patterned. According to one embodiment, this step involves removing a portion of third silicon dioxide layer 59 to leave portions 68 and 69 of piezoelectric stack layer 61 and portion 78 of the silicon wafer exposed. According to one embodiment, this patterning is carried out using the $CHF_3$ reactive ion etch process.

Figure 23:
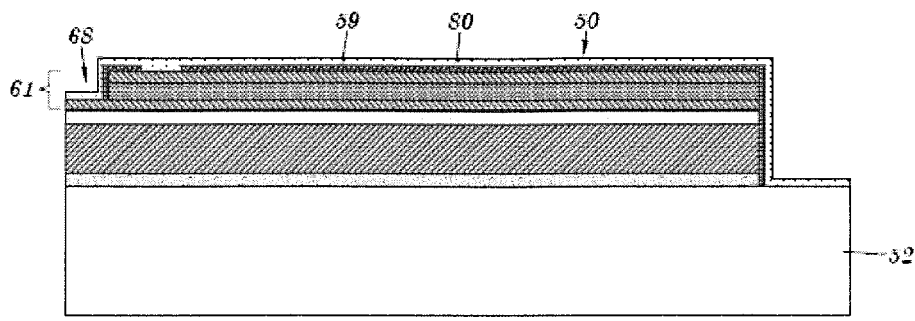
FIG. 23 is a side view of the layered material stack of FIG. 22, in which a metal bondpad layer has been deposited over the patterned third silicon dioxide layer, and portions of the piezoelectric stack and silicon wafer.

A further (optional) method step is illustrated in FIG. 23, which illustrates metal bondpad layer 80 deposited over the patterned third silicon dioxide layer 59, as well as portion 68 of piezoelectric stack layer 61 and portion 78 of silicon wafer 52. Bondpad layer 80 provides a surface that allows for a robust wire bond to be formed to the device, ensuring good electrical connection. According to one embodiment, metal bondpad layer 80 is deposited to a thickness of about 1 μm, and is a metal material (e.g., Al). This layer is deposited to improve reliability of the wire bond.

Figure 24:
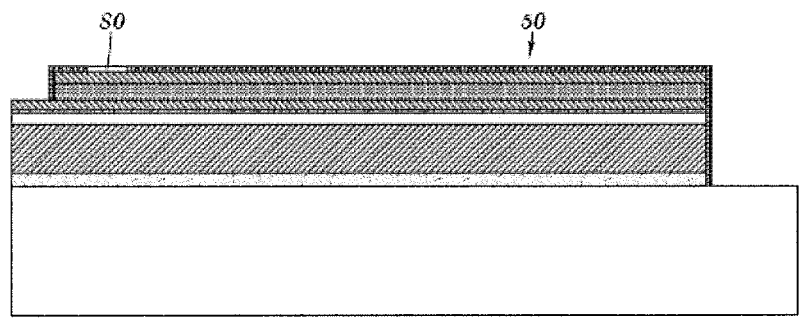
FIG. 24 is a side view of the layered material stack of FIG. 23, which has been patterned to remove portions of the metal bondpad layer.

FIG. 24 illustrates the next method step, which involves patterning metal bondpad layer 80 when present. According to one embodiment, metal bondpad layer 80 is patterned slightly longer than openings for top and bottom electrode connections. In one embodiment, patterning of metal bondpad layer 80 is carried out using wet etch chemistry based on phosphoric acid. However, other methods may also be used.

Figure 25:
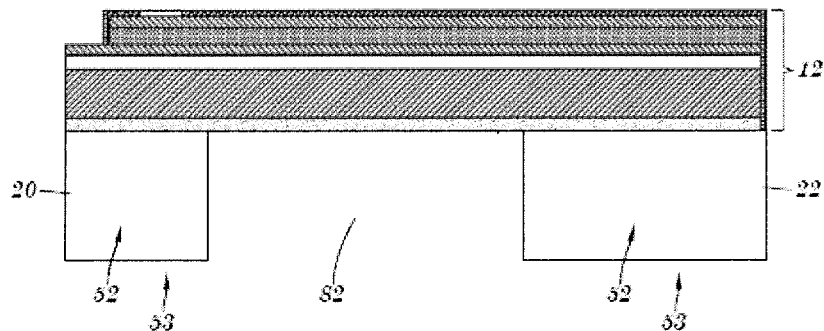
FIG. 25 is a side view of the layered material stack of FIG. 24, in which portions of the silicon wafer has been etched to create a resonator beam, a base, and a mass, thus creating one embodiment of a cantilever structure for use in an energy harvester device of the present invention.

The next process step is illustrated in FIG. 25, where silicon wafer 52 is etched at surface 53 to create resonator beam 12, base 20, mass 22, and stopper 14, thus producing one embodiment of the energy harvesting device of the present invention. In other words, portions of silicon wafer 52 are etched away to create a cavity 82 beneath what has become resonator beam 12 to create the separation between the portion of silicon wafer 52 that has become base 20 and portion of silicon wafer 52 that has become mass 22. Likewise, a portion of silicon wafer 52 is etched away to create stopper 14, which is resonator beam 12 extending beyond the edge of mass 52. According to one embodiment, etching silicon wafer 52 is carried out using lithography techniques and deep reactive ion etch with $SF_6/C_4F_8$ chemistry.

Figure 26:
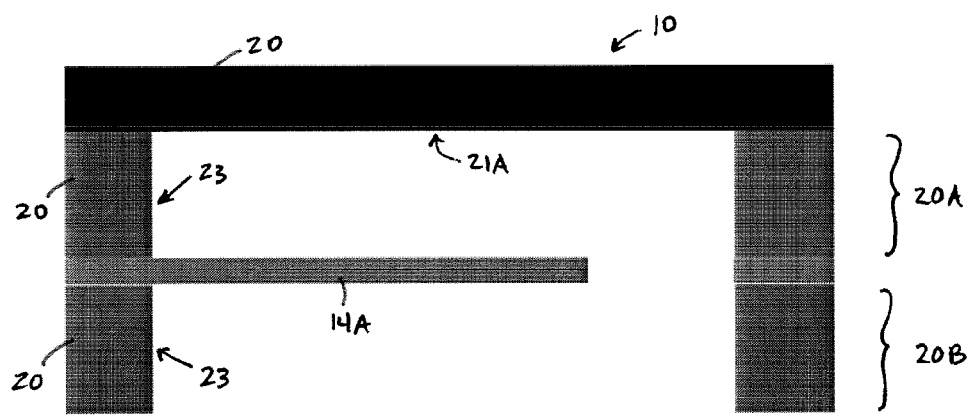
FIG. 26 is a side view of a section of the energy harvester device illustrated in FIG. 11A.
Figure 27A:
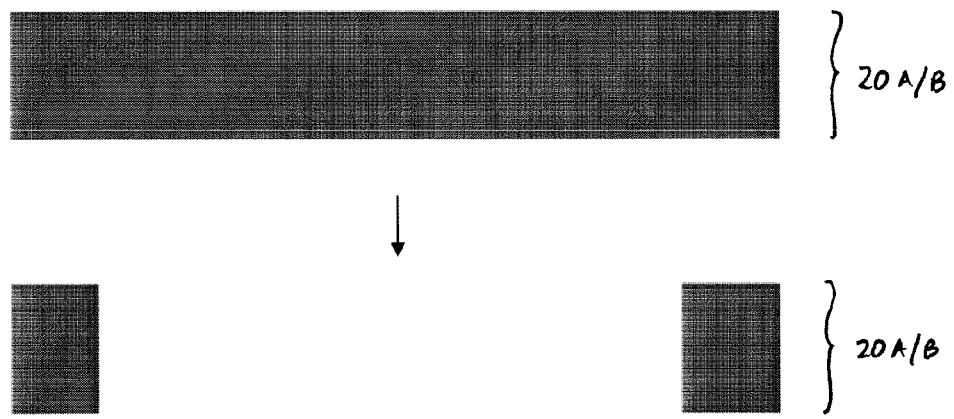
FIGS. 27A-C are side view illustrations of process steps for forming the section (i.e., upper portion) of the energy harvester device 10 with compliant stopper 14A of FIG. 26.
Figure 27B:
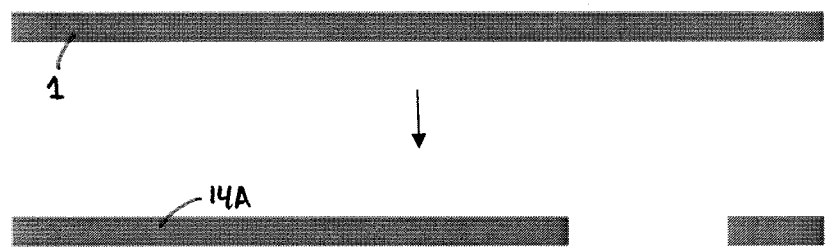
Figure 27C:
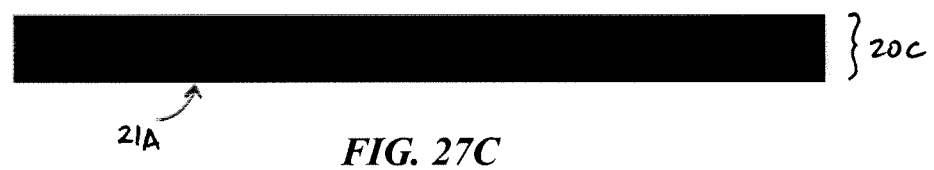

Forming the compliant stopper of the energy harvester device of the present invention may be carried out by a variety of methods. The following are non-limiting examples of how to form the compliant stopper. In a first example, a compliant stopper as illustrated in FIGS. 11A-B is formed as illustrated in FIG. 26 and FIGS. 27A-C. FIG. 26 is a side view of the upper portion of energy harvester device 10 of FIGS. 11A-B, with compliant stopper 14A in place. FIGS. 27A-C illustrate the process steps for forming energy harvester device 10 with compliant stopper 14A. In a first step, section 20B of package 20 is formed from a material suitable for forming package 20. For example, section 20B is a glass substrate, having a thickness of about 0.1 mm, 0.2 mm, 0.3, mm, 0.4 mm, 0.5 mm, 0.6 mm, 0.7 mm, 0.8 mm, 0.9 mm, or about 1.0 mm. Section 20B is patterned and etched by techniques known in the art (e.g., sand blasting, laser cutting, wet etching, CNC machining, etc., to form the structure illustrated in side view in FIG. 27A. This same process is repeated to form section 20A of package 20, which may be formed of the same or a different material from section 20B, and may have the same or a different thickness than section 20B. According to one embodiment, section 20A has a thickness slightly greater than section 20B, e.g., about 0.05 mm greater, 0.1 mm greater, 0.15 mm greater, or about 0.2 mm greater.

Turning now to FIG. 27B, a third substrate (substrate 1) is provided, which may or may not be the same material as section 20A and section 20B, and which is about 0.01 mm, 0.02 mm, 0.03 mm, 0.04 mm, 0.05 mm, 0.06 mm, 0.07 mm, 0.08 mm, 0.09 mm, 0.1 mm, 0.11 mm, 0.12 mm, 0.13 mm, 0.14 mm, 0.15 mm, 0.16 mm, 0.17 mm, 0.18 mm, 0.19 mm, or about 0.2 mm thick. Substrate 1 is patterned and etched according to techniques known in the art to form compliant stopper 14A.

As illustrated in FIG. 27C, a fourth substrate (section 20C of package 20) is also provided, which may or may not be formed of the same material as section 20A, and, according to one embodiment, has a thickness approximately equal to that of section 20A.

Sections 20A and 20B (FIG. 27A), compliant stopper 14A (FIG. 27B), and section 20C (FIG. 27C) are aligned and bonded together using methods known in the art (e.g., laser recrystallization, frit bonding) to form the bonded stack that is the package with the compliant stopper illustrated in FIG. 26.

Figure 28:
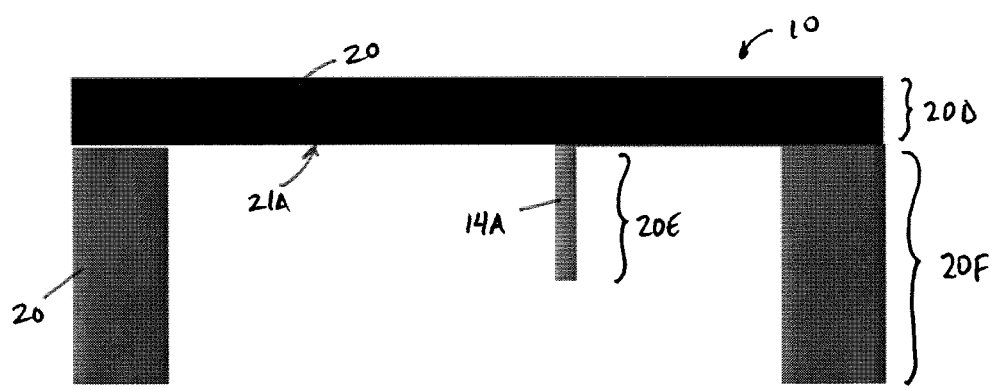
FIG. 28 is a side view of a section of the energy harvester device illustrated in FIG. 15.

In a second example, a compliant stopper as illustrated in FIG. 15 is formed as illustrated in FIG. 28 and FIGS. 29A-C. FIG. 28 is a side view of an upper portion of energy harvester device 10 of FIG. 15, with compliant stopper 14A in place. FIGS. 19A-C illustrate the process steps for forming energy harvester device 10 with compliant stopper 14A. In a first step, section 20D is formed from a material suitable for forming package 20. For example, section 20D is a glass substrate, which has a thickness of about 0.1 mm, 0.2 mm, 0.3 mm, 0.4 mm, 0.5 mm, 0.6 mm, 0.7 mm, 0.8 mm, 0.9 mm, 1.0 mm, 1.1 mm, 1.2 mm, 1.3 mm, 1.4 mm, 1.5 mm, 1.6 mm, 1.7 mm, 1.8 mm, 1.9 mm, or about 2.0 mm. Section 20D is bonded to a substrate (e.g., silicon) referred to in FIG. 29A as section 20E. Section 20E may have a thickness of about 50 microns, 100 microns, 150 microns, 200 microns, 250 microns, 300 microns, 350 microns, 400 microns, 450 microns, 500 microns, or about 550 microns.

Figure 29A:
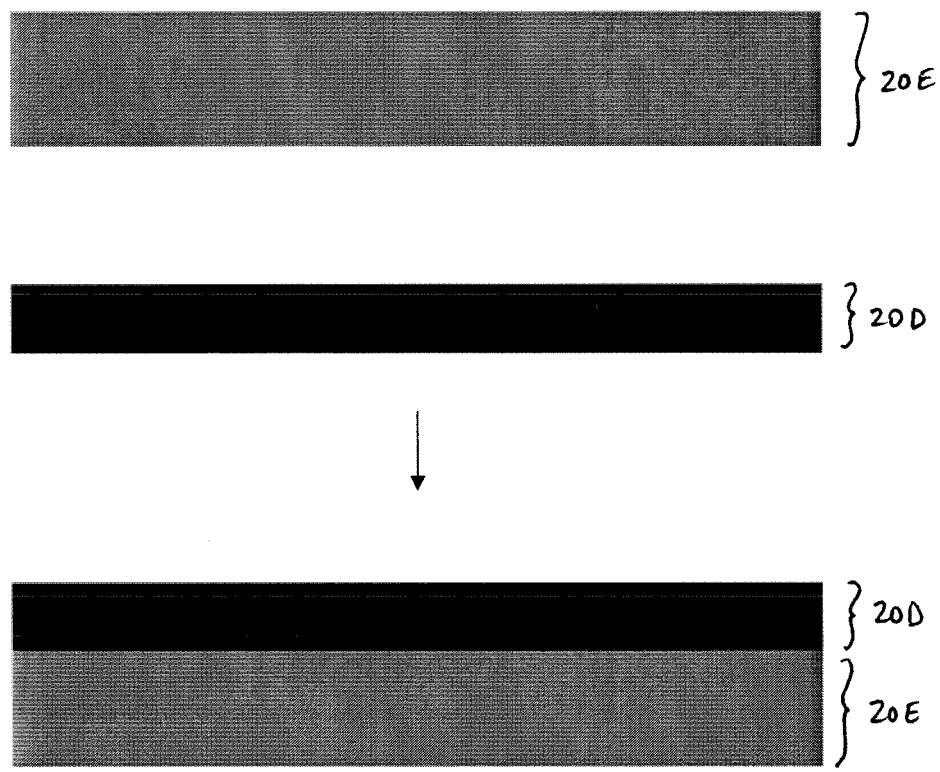
FIGS. 29A-C are side view illustrations of process steps for forming the section (i.e., upper portion) of the energy harvester device 10 with compliant stopper 14A of FIG. 28.
Figure 29B:
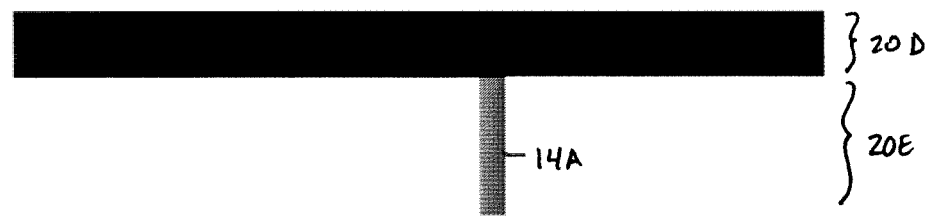

As illustrated in FIG. 29B, section 20E is patterned and etched to form compliant stopper 14A, which according to one particular embodiment, has a 3:1 height:width aspect ratio.

Figure 29C:
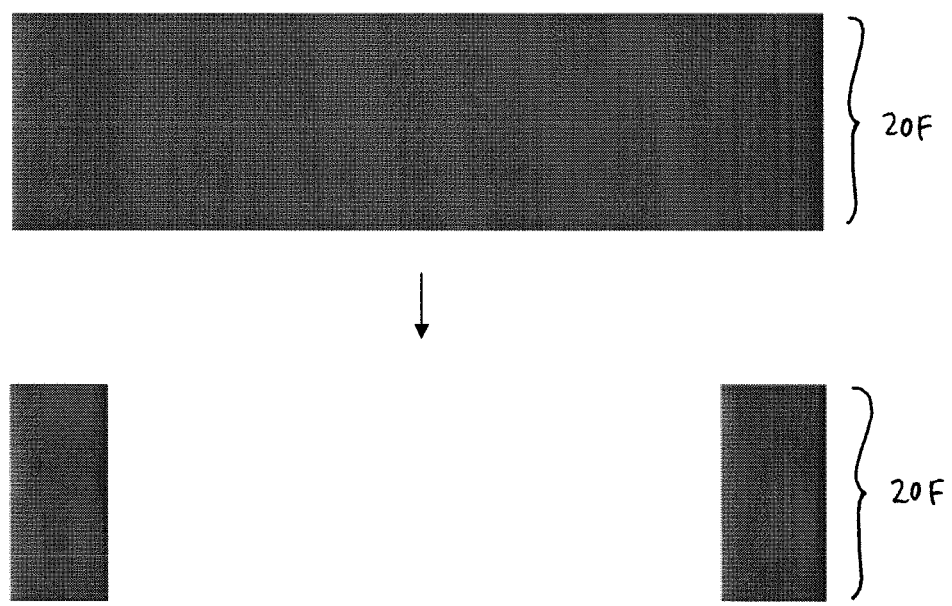

Another substrate (e.g., silicon) referred to as section 20F in FIG. 29C is provided. Section 20F may have a thickness of about 600 microns, 625 microns, 650 microns, 675 microns, 700 microns, 725 microns, 750 microns, 775 microns, 800 microns 825 microns, or about 850 microns. Section 20F is patterned and etched. Section 20F is bonded to sections 20E and 20D using techniques known in the art. For example, such bonding can be carried out using glass frit bonding due to the hermetic seal, or adhesive bonding. A package containing a compliant stopper is formed, as illustrated in FIG. 28.

EXAMPLES

The following examples are provided to illustrate embodiments of the present invention but are by no means intended to limit its scope.

Example 1

Packed Energy Harvester Device with Compliant Stopper

A MEMS energy harvester was placed in a package with a rigid 1 mm diameter stainless steel rod stopper suspended along the width of the harvester and aligned to come in contact with the harvester mass. The energy harvester is subjected to an impulse with a peak acceleration of 300 G, deflecting the tip 0.5 mm from the neutral position. When the harvester comes in contact with the stainless steel stopper, it breaks.

A similar MEMS energy harvester is placed in a package with a 1 mm diameter stainless steel rod stopper coated with a 0.3 mm thick layer of polyolefin, suspended along the width of the harvester, and aligned to come into contact with the harvester mass. The energy harvester is subjected to an impulse with a peak acceleration of 300 G, deflecting the tip 0.5 mm from the neutral position. When the harvester comes in contact with the polymer coated stainless steel stopper, it does not break.

All of the features described herein (including any accompanying claims, abstract and drawings), and/or all of the steps of any method or process so disclosed, may be combined with any of the above aspects in any combination, except combinations where at least some of such features and/or steps are mutually exclusive.

Although various embodiments have been depicted and described in detail herein, it will be apparent to those skilled in the relevant art that various modifications, additions, substitutions, and the like can be made without departing from the spirit of the invention and these are therefore considered to be within the scope of the invention as defined in the claims which follow.

What is claimed:

1. An energy harvester device comprising:
    an elongate resonator beam comprising a piezoelectric material, said resonator beam extending between first and second ends;
    a base connected to the resonator beam at the first end with the second end being freely extending from the base as a cantilever;
    a mass attached to the second end of the resonator beam;
    a package surrounding at least a portion of the second end of the resonator beam; and
    a compliant stopper connected to the package, wherein the stopper is configured to deform upon contact with the mass or resonator beam to stabilize motion of the cantilever to prevent breakage.

2. The device according to claim 1, wherein the compliant stopper is formed on an inside wall of the package.

3. The device according to claim 2, wherein the compliant stopper is formed on opposing inside walls of the package.

4. The device according to claim 1, wherein the package is formed as a single structure with the base.

5. The device according to claim 1, wherein the compliant stopper is constructed of a material selected from the group consisting of glass, metal, silicon, photoresist, polyimide, $SiO_2$, other complementary metal-oxide-semiconductor compatible materials, rubbers and other polymers, ceramics, foams, and combinations thereof.

6. The device according to claim 1, wherein the resonator beam comprises a laminate formed of a plurality of layers.

7. The device according to claim 6, wherein the plurality of layers comprise at least two different materials.

8. The device according to claim 1 further comprising:
    one or more electrodes in electrical contact with said piezoelectric material.

9. The device according to claim 8, wherein the one or more electrodes comprises a material selected from the group consisting of molybdenum and platinum.

10. The device according to claim 8 further comprising:
    electrical harvesting circuitry in electrical connection with the one or more electrodes to harvest electrical energy from said piezoelectric material.

11. The device according to claim 1, wherein the piezoelectric material is selected from the group consisting of aluminum nitride, zinc oxide, PVDF and lead zirconate titinate compounds.

12. The device according to claim 1, wherein the compliant stopper is configured to contact the cantilever at a torque neutral position.

* * * * *